US012731641B2

(12) United States Patent
Luo et al.

(10) Patent No.: US 12,731,641 B2
(45) Date of Patent: Sep. 8, 2026

(54) MICROELECTRONIC DEVICES INCLUDING INTERCONNECTIONS, RELATED MEMORY DEVICES AND ELECTRONIC SYSTEMS

(71) Applicant: Micron Technology, Inc., Boise, ID (US)

(72) Inventors: Shuangqiang Luo, Boise, ID (US); Indra V. Chary, Boise, ID (US); Mithun Kumar Ramasahayam, Merdian, ID (US)

(73) Assignee: Micron Technology, Inc., Boise, ID (US)

( * ) Notice: Subject to any disclaimer, the term of this patent is extended or adjusted under 35 U.S.C. 154(b) by 512 days.

(21) Appl. No.: 17/659,102

(22) Filed: Apr. 13, 2022

(65) Prior Publication Data

US 2023/0335193 A1 Oct. 19, 2023

(51) Int. Cl.

| | |
|---|---|
| ***H10B 41/27*** | (2023.01) |
| ***G11C 16/04*** | (2006.01) |
| ***H10B 41/35*** | (2023.01) |
| ***H10B 43/27*** | (2023.01) |
| ***H10B 43/35*** | (2023.01) |
| ***H10W 20/41*** | (2026.01) |

(52) U.S. Cl.

CPC ......... *G11C 16/0483* (2013.01); *H10B 41/27* (2023.02); *H10B 41/35* (2023.02); *H10B 43/27* (2023.02); *H10B 43/35* (2023.02); *H10W 20/435* (2026.01)

(58) Field of Classification Search

CPC .... G11C 16/0483; H10B 43/35; H10B 41/35; H10B 41/27; H10B 43/27; H01L 23/5283

See application file for complete search history.

(56) References Cited

U.S. PATENT DOCUMENTS

| | | | | |
|---|---|---|---|---|
| 2014/0167131 | A1* | 6/2014 | Lu | H10D 30/0411 438/257 |
| 2019/0206885 | A1* | 7/2019 | Wang | H10B 41/27 |
| 2020/0403005 | A1* | 12/2020 | Sakurai | H01L 21/31144 |
| 2021/0134832 | A1* | 5/2021 | Choi | H10B 43/10 |
| 2021/0366924 | A1* | 11/2021 | Tokita | H10B 41/27 |
| 2022/0093644 | A1* | 3/2022 | Sharangpani | H10B 43/27 |
| 2022/0406805 | A1* | 12/2022 | Yang | H10B 41/27 |

(Continued)

*Primary Examiner* — Matthew C Landau
*Assistant Examiner* — David W Ward
(74) *Attorney, Agent, or Firm* — TraskBritt

(57) ABSTRACT

A microelectronic device comprises a stack structure comprising blocks each including a vertically alternating sequence of conductive material and insulative material arranged in tiers, at least one of the blocks comprising: a memory array region having vertically extending strings of memory cells within a horizontal area thereof; and a staircase region horizontally neighboring the memory array region. The staircase structure has steps comprising horizontal ends of the tiers; and a crest sub-region horizontally interposed between the staircase structure and the memory array region. A masking structure overlies the stack structure and has a different material composition than each of the conductive material and the insulative material. Filled slot structures are interposed between the blocks of the stack structure, at least one of the filled slot structures comprises at least one fill material that has an uppermost boundary vertically underlying an uppermost boundary of the masking structure.

23 Claims, 19 Drawing Sheets

(56) References Cited

U.S. PATENT DOCUMENTS

2023/0128682 A1* 4/2023 Sondhi .................. H10B 41/27
257/314
2023/0129594 A1* 4/2023 Sharangpani .......... H10B 43/10
257/774

* cited by examiner 100
119
115
169
151B
151
151A
B
106
104
108
102
102B
101
103
113
109

Z
Y
X
107A
107
105A
105
105B
102A
110
A
107B

MICROELECTRONIC DEVICES INCLUDING INTERCONNECTIONS, RELATED MEMORY DEVICES AND ELECTRONIC SYSTEMS

TECHNICAL FIELD

The disclosure, in various embodiments, relates generally to the field of integrated circuit device design and fabrication. More specifically, the disclosure relates to microelectronic devices including contact structures, filled slot structures and contacts, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND ("not and" logic) Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s) of the memory device and access lines (e.g., word lines)) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device, and installing contact structures through the stack structures, including through the staircase structures. The contact structures also are installed through crest regions of the stack structures as well as central regions that are between staircase structures. The staircase structures includes individual "steps" defining contact regions of the conductive structures, upon which step contact structures can be positioned to provide electrical access to the conductive structures. Within memory array regions as well as within the stack structure regions, first plug structures and second plug structures, provide communications interfaces for the integrated circuit device.

Unfortunately, conventional methods of forming a memory device, such as a NAND Flash memory device, can result in undesirable damage to the memory devices, such as off-center registration of top contacts after processing, which may lead to undesirable structural configurations and/or undesirable damage to features during the formation of additional features.

DETAILED DESCRIPTION

Figure 1:
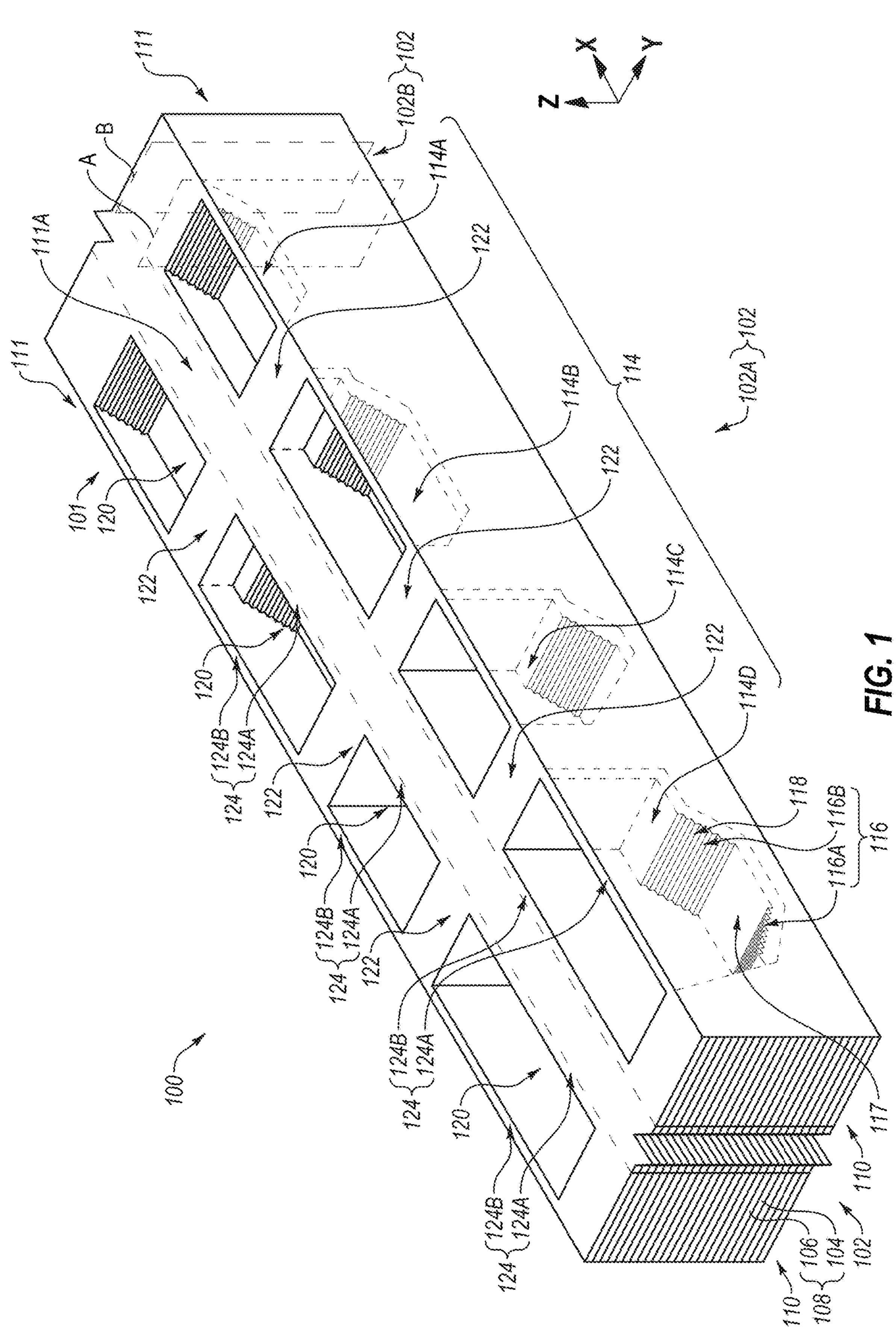
FIGS. 1, 1A, and 1B are simplified views of a microelectronic device structure during a processing stage of a method of forming a microelectronic device, in accordance with several embodiments of this disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures useful to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radiofrequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be assembled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about 10-8 Siemens per centimeter (S/cm) and about $10^4$ S/cm ($10^6$ S/m) at room temperature. Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide (InxO), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 through FIG. 15B are various views (described in further detail below) illustrating a microelectronic device structure at different processing stages of a method of forming a microelectronic device (e.g., a memory device, such as a 3D NAND Flash memory device), in accordance with embodiments of the disclosure. With the description provided below, it will be readily apparent to one of ordinary skill in the art that the methods described herein may be used for forming various devices. In other words, the methods of the disclosure may be used whenever it is desired to form a microelectronic device.

Figures 1A, 1B:
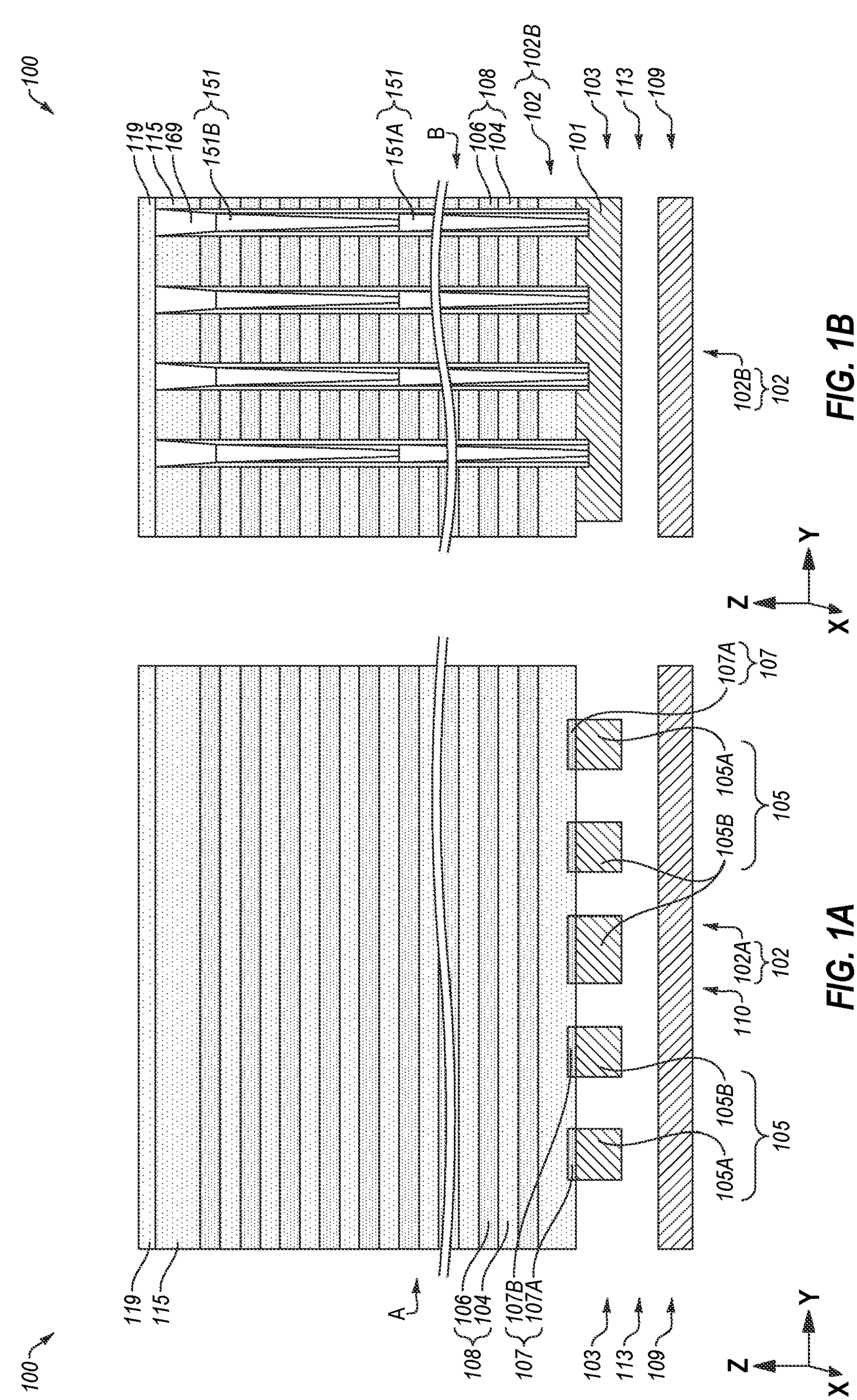

FIGS. 1, 1A, and 1B are simplified views of a microelectronic device structure 100 during a processing stage of a method of forming a microelectronic device, in accordance with several embodiments of this disclosure. FIG. 1 is a simplified, partial perspective view of the microelectronic device structure 100 during processing according to several embodiments. FIG. 1A is a simplified, partial cross-section elevation view of the microelectronic device structure 100 depicted in FIG. 1, taken from a section A from FIG. 1. FIG. 1B is a simplified, partial cross-section elevation view of the microelectronic device structure 100 depicted in FIG. 1, taken from a section B, in accordance with embodiments of the disclosure.

As shown in FIG. 1, the microelectronic device structure 100 may include a preliminary stack structure 102 including a distributed staircase region 102A and an array region 102B. The preliminary stack structure 102 includes a vertically alternating (e.g., in a Z-direction) sequence of insulative material 104 and sacrificial material 106 arranged in tiers 108. Each of the tiers 108 of the preliminary stack structure 102A and the preliminary array structure 102B may individually include the sacrificial material 106 vertically neighboring (e.g., directly vertically adjacent) the insulative material 104. In addition, the preliminary stack structure 102 may include preliminary block areas 110 (e.g., future preliminary blocks 130 (FIG. 3A)) separated from one another by slot areas 111 (e.g., future slit areas, future isolation trench areas to be processed into slot areas, future opening areas, future trench areas). Three slot areas 111 are depicted, with a central slot area 111A designated with dashed lines that separate the preliminary stack structure 102 into two preliminary block areas 110 as illustrated. Additional features (e.g., materials, structures) of the preliminary stack structure 102 (including the preliminary block areas 110 thereof) are described in further detail below. The slot areas 111 will set apart the preliminary block areas 110.

The preliminary block areas 110 of the preliminary stack structure 102 may individually include stadium structures 114, crest regions 122 (e.g., elevated regions), and bridge regions 124 (e.g., additional elevated regions). The stadium structures 114 may be distributed throughout and substantially confined within the preliminary block areas 110. As shown in FIG. 1, within an individual preliminary block area 110 the preliminary stack structure 102 may be formed to include a first stadium structure 114A, a second stadium structure 114B vertically below (e.g., in the Z-direction) and horizontally offset from (e.g., in the X-direction) the first stadium structure 114A, a third stadium structure 114C vertically below (e.g., in the Z-direction) and horizontally offset from (e.g., in the X-direction) the second stadium structure 114B, and a fourth stadium structure 114D vertically below (e.g., in the Z-direction) and horizontally offset from (e.g., in the X-direction) the third stadium structure 114C. In additional embodiments, an individual preliminary block area 110 of the preliminary stack structure 102 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). Furthermore, in additional embodiments, within an individual preliminary block area 110, vertical positions (e.g., in the Z-direction) of the stadium structures 114 may vary in a different manner (e.g., may alternate between relatively deeper and relatively shallower vertical positions) than that depicted in FIG. 1.

The insulative material 104 of each of the tiers 108 of the preliminary stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). In some embodiments, the insulative material 104 of each of the tiers 108 of the preliminary stack structure 102 is formed of and includes a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The sacrificial material 106 of each of the tiers 108 of the preliminary stack structure 102 may be formed of and include at least one material (e.g., at least one insulative material) that may be selectively removed relative to the insulative material 104. The sacrificial material 106 may be selectively etchable relative to the insulative material 104 during common (e.g., collective, mutual) exposure to a first etchant; and the insulative material 104 may be selectively etchable to the sacrificial material 106 during common exposure to a second, different etchant. As used herein, a material is "selectively etchable" relative to another material if the material exhibits an etch rate that is at least about five times (5×) greater than the etch rate of another material, such as about ten times (10×) greater, about twenty times (20×) greater, or about forty times (40×) greater. By way of non-limiting example, depending on the material composition of the insulative material 104, the sacrificial material 106 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and a $MgO_x$), at least one dielectric nitride material (e.g., $SiN_y$), at least one dielectric oxynitride material (e.g., $SiO_xN_y$), at least one dielectric oxycarbide material (e.g., $SiO_xC_y$), at least one hydrogenated dielectric oxycarbide material (e.g., $SiC_xO_yH_z$), at least one dielectric carboxynitride material (e.g., $SiO_xC_zN_y$), and at least one semiconductive material (e.g., polycrystalline silicon, or "poly"). In some embodiments, the sacrificial material 106 of each of the tiers 108 of the preliminary stack structure 102 is formed of and includes a dielectric nitride material, such as $SiN_y$ (e.g., $Si_3N_4$). The sacrificial material 106 may, for example, be selectively etchable relative to the insulative material 104 during common exposure to a wet etchant comprising phosphoric acid ($H_3PO_4$).

The preliminary stack structure 102 may be formed to include any desired number of the tiers 108. By way of non-limiting example, the preliminary stack structure 102 may be formed to include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Still referring to FIG. 1, the preliminary block areas 110 of the preliminary stack structure 102 may horizontally extend parallel in an X-direction. As used herein, the term "parallel" means substantially parallel. Horizontally neighboring preliminary block areas 110 of the preliminary stack structure 102 may be separated from one another in a Y-direction orthogonal to the X-direction by the slot areas 111. The slot areas 111 may also horizontally extend parallel in the X-direction. Each of the preliminary block areas 110 of the preliminary stack structure 102 may exhibit substantially the same geometric configuration (e.g., substantially the same dimensions and substantially the same shape) as each other of the preliminary block areas 110, or one or more of the preliminary block areas 110 may exhibit a different geometric configuration (e.g., one or more different dimensions and/or a different shape) than one or more other of the preliminary block areas 110. In addition, each pair of horizontally neighboring preliminary block areas 110 of the preliminary stack structure 102 may be horizontally separated from one another by substantially the same distance (e.g., corresponding to a width in the Y-direction of each of the slot areas 111) as each other pair of horizontally neighboring preliminary block areas 110 of the preliminary stack structure 102, or at least one pair of horizontally neighboring preliminary block areas 110 of the preliminary stack structure 102 may be horizontally separated from one another by a different distance than that separating at least one other pair of horizontally neighboring preliminary block areas 110 of the preliminary stack structure 102. In some embodiments, the preliminary block areas 110 of the preliminary stack structure 102 are substantially uniformly (e.g., substantially non-variably, substantially equally, substantially consistently) sized, shaped, and spaced relative to one another.

Still referring to FIG. 1, each stadium structure 114 may include opposing staircase structures 116, and a central region 117 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1. As a non-limiting example, at least one stadium structures 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 117 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure

116B) of an individual stadium structure 114 each include steps 118 defined by edges (e.g., horizontal ends) of the tiers 108 of the preliminary stack structure 102 within an individual preliminary block area 110 of the preliminary stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 117 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114.

Each of the stadium structures 114 within an individual preliminary block area 110 of the preliminary stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1A, in some embodiments, the steps 118 of each of the stadium structures 114 are arranged in order, such that steps 118 directly horizontally adjacent (e.g., in the X-direction) one another correspond to tiers 108 of the preliminary stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of preliminary stack structure 102 not directly vertically adjacent (e.g., in the Z-direction) one another.

With continued reference to FIG. 1, for an individual stadium structure 114, the central region 117 thereof may horizontally intervene (e.g., in the X-direction) between and separate the forward staircase structure 116A thereof from the reverse staircase structure 116B thereof. The central region 117 may horizontally neighbor a vertically lowermost step 118 of the forward staircase structure 116A, and may also horizontally neighbor a vertically lowermost step 118 of the reverse staircase structure 116B. The central region 117 of an individual stadium structure 114 may have any desired horizontal dimensions. In addition, within an individual preliminary block area 110 of the preliminary stack structure 102, the central region 117 of each of the stadium structures 114 may have substantially the same horizontal dimensions as the central region 117 of each other of the stadium structures 114, or the central region 117 of at least one of the stadium structures 114 may have different horizontal dimensions than the central region 117 of at least one other of the stadium structures 114.

For each preliminary block area 110 of the preliminary stack structure 102, each stadium structure 114 (including the forward staircase structure 116A, the reverse staircase structure 116B, and the central region 117 thereof) within the preliminary block area 110 may individually partially define boundaries (e.g., horizontal boundaries, vertical boundaries) of a filled trench 120 vertically extending (e.g., in the Z-direction) through the preliminary block area 110. The crest regions 122 and the bridge regions 124 horizontally neighboring an individual stadium structure 114 may also partially define the boundaries of the filled trench 120 associated with the stadium structure 114. The filled trench 120 may only vertically extend through tiers 108 of the preliminary stack structure 102 defining the forward staircase structure 116A and the reverse staircase structure 116B of the stadium structure 114; or may also vertically extend through additional tiers 108 of the preliminary stack structure 102 not defining the forward staircase structure 116A and the reverse staircase structure 116B of the stadium structure 114, such as additional tiers 108 of the preliminary stack structure 102 vertically overlying the stadium structure 114. Edges of the additional tiers 108 of the preliminary stack structure 102 may, for example, define one or more additional stadium structures vertically overlying and horizontally offset from the stadium structure 114. Still referring to FIG. 1A, for each preliminary block area 110 of the preliminary stack structure 102, the crest regions 122 (which may also be referred to as "elevated regions" or "plateau regions") and the bridge regions 124 (which may also be referred to as "additional elevated regions" or "additional plateau regions") thereof may comprise portions of the preliminary block area 110 remaining following the formation of the stadium structures 114. Within each preliminary block area 110, crest regions 122 and the bridge region 124 thereof may define horizontal boundaries (e.g., in the X-direction and in the Y-direction) of unremoved portions of the tiers 108 of the preliminary stack structure 102.

As shown in FIG. 1, the crest regions 122 of an individual preliminary block area 110 of the preliminary stack structure 102 may intervene between and separate stadium structures 114 horizontally neighboring one another in the X-direction. For example, one of the crest regions 122 may intervene between and separate the first stadium structure 114A and the second stadium structure 114B; an additional one of the crest regions 122 may intervene between and separate the second stadium structure 114B and the third stadium structure 114C; and a further one of the crest regions 122 may intervene between and separate the third stadium structure 114C and the fourth stadium structure 114D. A vertical height of the crest regions 122 in the Z-direction may be substantially equal to a maximum vertical height of the preliminary block area 110 in the Z-direction; and a horizontal width of the crest regions 122 in the Y-direction may be substantially equal to a maximum horizontal width of the preliminary block area 110 in the Y-direction. In addition, each of the crest regions 122 may individually exhibit a desired horizontal length in the X-direction. Each of the crest regions 122 of an individual preliminary block area 110 of the preliminary stack structure 102 may exhibit substantially the same horizontal length in the X-direction as each other of the crest regions 122 of the preliminary block area 110; or at least one of the crest regions 122 of the preliminary block area 110 may exhibit a different horizontal length in the X-direction than at least one other of the crest regions 122 of the preliminary block area 110.

As shown in FIG. 1, the bridge regions 124 of an individual preliminary block area 110 of the preliminary stack structure 102 may intervene between and separate the stadium structures 114 if the preliminary block area 110 from the slot areas 111 horizontally neighboring the preliminary block area 110 in the Y-direction. For example, for each stadium structure 114 within an individual preliminary block area 110 of the preliminary stack structure 102, a first bridge region 124A may be horizontally interposed in the Y-direction between a first side of the stadium structure 114 and a first of the slot areas 111 horizontally neighboring the preliminary block area 110; and a second bridge region 124B may be horizontally interposed in the Y-direction between a second side of the stadium structure 114 and a second of the slot areas 111 horizontally neighboring the preliminary block area 110. The first bridge region 124A and the second bridge region 124B may horizontally extend in parallel in the X-direction. In addition, the first bridge region 124A and the second bridge region 124B may each horizontally extend from and between crest regions 122 of the preliminary block area 110 horizontally neighboring one another in the X-direction. The bridge regions 124 of the preliminary block area 110 may be integral and continuous with the crest regions 122 of the preliminary block area 110. Upper boundaries (e.g., upper surfaces) of the bridge regions 124 may be substantially coplanar with upper boundaries of the crest regions 122. A vertical height of the bridge regions 124 in the Z-direction may be substantially equal to a maximum vertical height of the preliminary block area 110 in the Z-direction. In addition, each of the bridge regions 124 (including each first bridge region 124A and each second bridge region 124B) may individually exhibit a desired horizontal width in the Y-direction and a desired horizontal length in the X-direction. Each of the bridge regions 124 of the preliminary block area 110 may exhibit substantially the same horizontal length in the X-direction as each other of the bridge regions 124 of the preliminary block area 110; or at least one of the bridge regions 124 of the preliminary block area 110 may exhibit a different horizontal length in the X-direction than at least one other of the bridge regions 124 of the preliminary block area 110. In addition, each of the bridge regions 124 of the preliminary block area 110 may exhibit substantially the same horizontal width in the Y-direction as each other of the bridge regions 124 of the preliminary block area 110; or at least one of the bridge regions 124 of the preliminary block area 110 may exhibit a different horizontal width in the Y-direction than at least one other of the bridge regions 124 of the preliminary block area 110. In FIG. 1, for clarity and ease of understanding the drawings and associated description, portions (e.g., some of the bridge regions 124 horizontally neighboring first sides of the stadium structures 114 in the Y-direction) of one of the preliminary block areas 110 of the preliminary stack structure 102 are depicted as transparent to more clearly show the stadium structures 114 distributed within the preliminary block area 110.

For each preliminary block area 110 of the preliminary stack structure 102, the bridge regions 124 thereof horizontally extend around the filled trenches 120 of the preliminary block area 110. As described in further detail below, following subsequent processing (e.g., so-called "replacement gate" or "gate last" processing), some of the bridge regions 124 of the preliminary block area 110 may be employed to form continuous conductive paths extending from and between horizontally neighboring crest regions 122 of the preliminary block area 110. As also described in further detail below, following such subsequent (e.g., replacement gate) processing, at least the bridge regions 124 (e.g., the first bridge region 124A and the second bridge region 124B) horizontally neighboring the first stadium structure 114A in the Y-direction may be further acted upon (e.g., segmented) to disrupt (e.g., break) at least a portion of the continuous conductive paths extending from and between the crest regions 122 horizontally neighboring the first stadium structure 114A in the X-direction. Selected results of replacement gate processing are depicted in part at FIGS. 8A, 8B and FIGS. 9A and 9B, after several processing stages of this disclosure.

Referring collectively to FIGS. 1A and 1B, the microelectronic device structure 100 further includes a source tier 103 vertically below (e.g., in the Z-direction) the preliminary stack structure 102, and a routing tier 109 vertically below the source tier 103. In addition, an interconnect tier 113 may vertically intervene between the source tier 103 and the routing tier 109, and may include interconnect structures facilitates electronical communication between conductive structures of the source tier 103 and additional conductive structures of the routing tier 109 (as described in further detail below).

Within a horizontal area of the distributed staircase region 102A (FIG. 1A) of the preliminary stack structure 102, the source tier 103 includes discrete conductive structures 105, including first discrete conductive structures 105A (also referred to herein as "source-tier slot-bottom structures") and second discrete conductive structures 105B (also referred to herein as "source-tier contact structures"). Additionally, etch stop structures 107 may be formed on or over the discrete conductive structures 105, including first etch stop structures 107A (also referred to herein as "slot-bottom etch stop structures") on or over the first discrete conductive structures 105A, and second etch stop structures 107B (also referred to herein as "contact etch stop structures") on or over the second discrete conductive structures 105B. Furthermore, within a horizontal area of the array region 102B (FIG. 1B) of the preliminary stack structure 102 may include at least one conductive source structure 101 (e.g., conductive source plate, conductive source lines). The discrete conductive structures 105 and the conductive source structure 101 of the source tier 103 may be electrically isolated from one another.

Referring to FIG. 1B, within a horizontal area of the array region 102B of the preliminary stack structure 102 the microelectronic device structure 100 may further include pillar structures 151 vertically extending through the tiers 108 of the preliminary stack structure 102, and conductive array plugs 169 vertically overlying and in contact with the pillar structures 151. The pillar structures 151 may include lower pillar structures 151A and upper pillar structures 151B vertically overlying and in electrical communication with the lower pillar structures 151A.

The pillar structures 151, including the lower pillar structures 151A and the upper pillar structures 151B, may each individually be formed of and include a stack of materials. By way of non-limiting example, each of the pillar structures 151 may be formed to include a charge-blocking material, such as first dielectric oxide material (e.g., $SiO_x$, such as $SiO_2$; $AlO_x$, such as $Al_2O_3$); a charge-trapping material, such as a dielectric nitride material (e.g., $SiN_y$, such as $Si_3N_4$); a tunnel dielectric material, such as a second dielectric oxide material (e.g., $SiO_x$, such as $SiO_2$); a channel material, such as a semiconductor material (e.g., silicon, such as polycrystalline silicon); and a dielectric fill material (e.g., a dielectric oxide, a dielectric nitride, air). For an individual pillar structure 151, at least one first vertical portion (e.g., a vertical portion employed to form a vertically extending string of memory cells, as described in further detail below) thereof may include the charge-blocking material formed on or over surfaces (e.g., side surfaces) of the insulative material 104 and sacrificial material 106 of some of the tiers 108 of the preliminary stack structure 102 partially defining horizontal boundaries of the pillar structure 151; the charge-trapping material horizontally surrounded by the charge-blocking material; the tunnel dielectric material horizontally surrounded by the charge-trapping material; the channel material horizontally surrounded by the tunnel dielectric material; and the dielectric fill material horizontally surrounded by the channel material. Furthermore, second vertical portions (e.g., upper and lower vertical portions employed to form select transistors, as also described in further detail below) of the pillar structure 151 may include the tunnel dielectric material formed on or over surfaces (e.g., side surfaces) of the insulative material 104 and sacrificial material 106 of some other of the tiers 108 of preliminary stack structure 102 partially defining horizontal boundaries of the pillar structure 151; the channel material horizontally surrounded by the tunnel dielectric material; and the dielectric fill material horizontally surrounded by the channel material. The second vertical portions of the pillar structure 151 may be at least partially (e.g., substantially) free of the charge-blocking material and the charge-trapping material present within first vertical portion of the pillar structure 151.

Referring collectively to FIGS. 1A and 1B, the microelectronic device structure 100 is formed to further include isolation material 115 (e.g., dielectric material, such as a dielectric oxide material) overlying the preliminary stack structure 102, and masking material 119 on or over the isolation material 115. The masking material 119 may have a material composition having etch selectively relative to the isolation material 115, and the insulative material 104 and the sacrificial material 106 of the tiers of the preliminary stack structure 102. The masking material 119 may also have desirable etch stop characteristic and/or desirable abrasion resistance (e.g., CMP resistance) characteristics, as described in further detail below. A material composition of the masking material 119 may be different than material compositions of the isolation material 115, the insulative material 104, and the sacrificial material 106. In some embodiments, the masking material 119 is formed of and includes a carbon nitride (e.g., $CN_y$) material. In some embodiments, the masking material 119 is formed to have a vertical thickness (Z-direction) within greater than or equal to about 50 nanometers (nm), such as within a range of from about 50 nm to about 500 nm, from about 50 nm to about 300 nm, from about 50 nm to about 200, or from about 100 nm to about 200 nm.

Figures 2A, 2B:
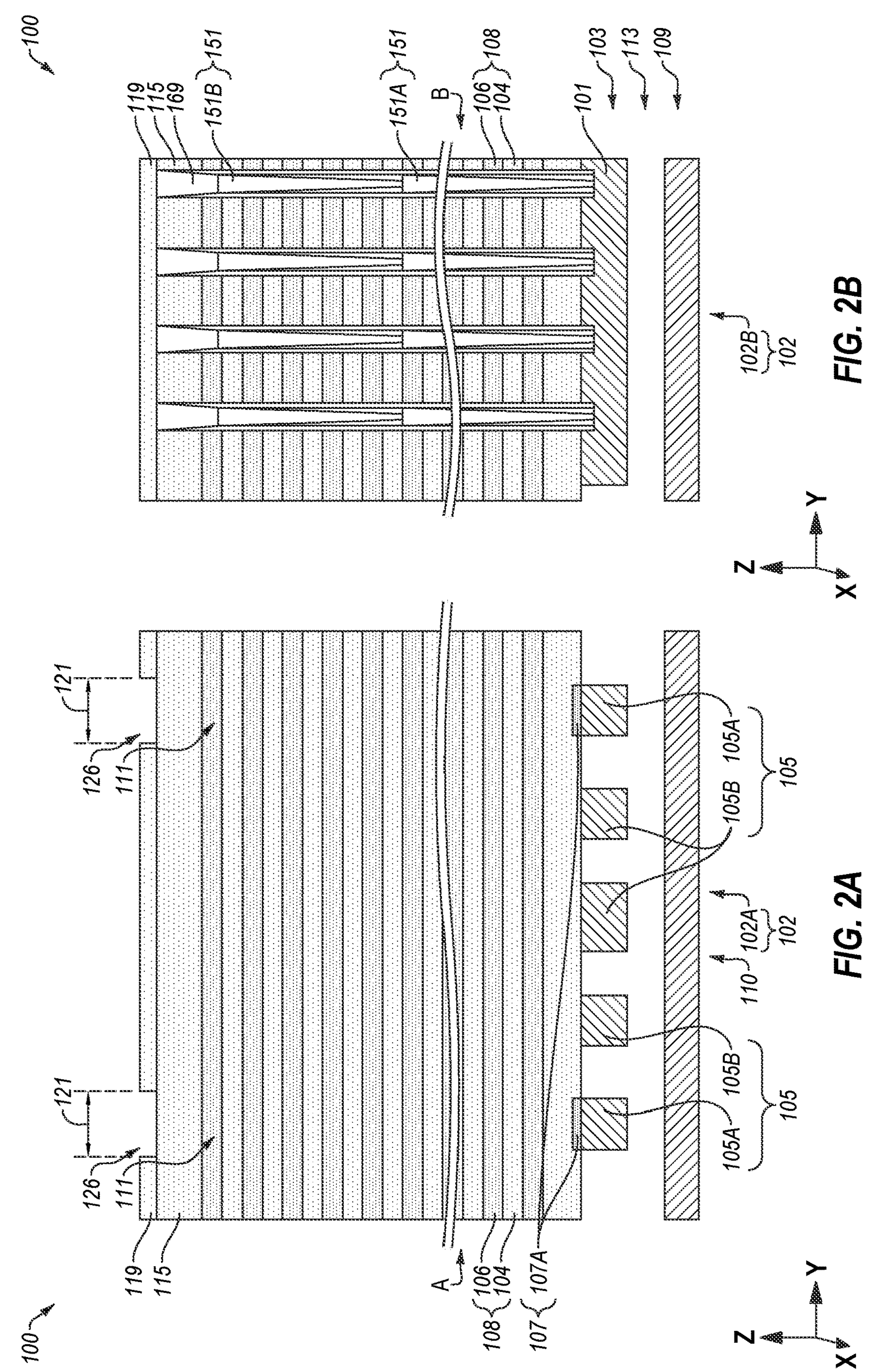
FIG. 2A is a simplified, longitudinal cross-sectional view of the portion of the microelectronic device structure shown in FIG. 1A at another processing stage.
FIG. 2B is a simplified, longitudinal cross-sectional view of the portion of the microelectronic device structure shown in FIG. 1B at the processing stage of FIG. 2A.

FIG. 2A is a simplified, longitudinal cross-sectional view of the portion A of the microelectronic device structure 100 shown in FIG. 1A at another processing stage of the method of forming the microelectronic device following the processing stage of FIGS. 1, 1A, and 1B. FIG. 2B is a simplified, longitudinal cross-sectional view of the portion B of the microelectronic device structure 100 shown in FIG. 1B at the processing stage of FIG. 2A. Referring collectively to FIGS. 2A and 2B, portions of the masking material 119 horizontally overlapping the slot areas 111 of the preliminary stack structure 102 may be removed to form first openings 126 extending through the masking material 119 to the isolation material 115. The first openings 126 may individually have a first opening width 121 in the Y-direction. The portions of the masking material 119 may be removed by forming at least one additional material over the masking material 119, transferring a pattern formed in and defined by the additional material into the masking material 119, and then removing the additional material. Removal of the additional material after such pattern transfer may reduce the vertical thickness of the masking material 119 as well.

Figures 3A, 3B:
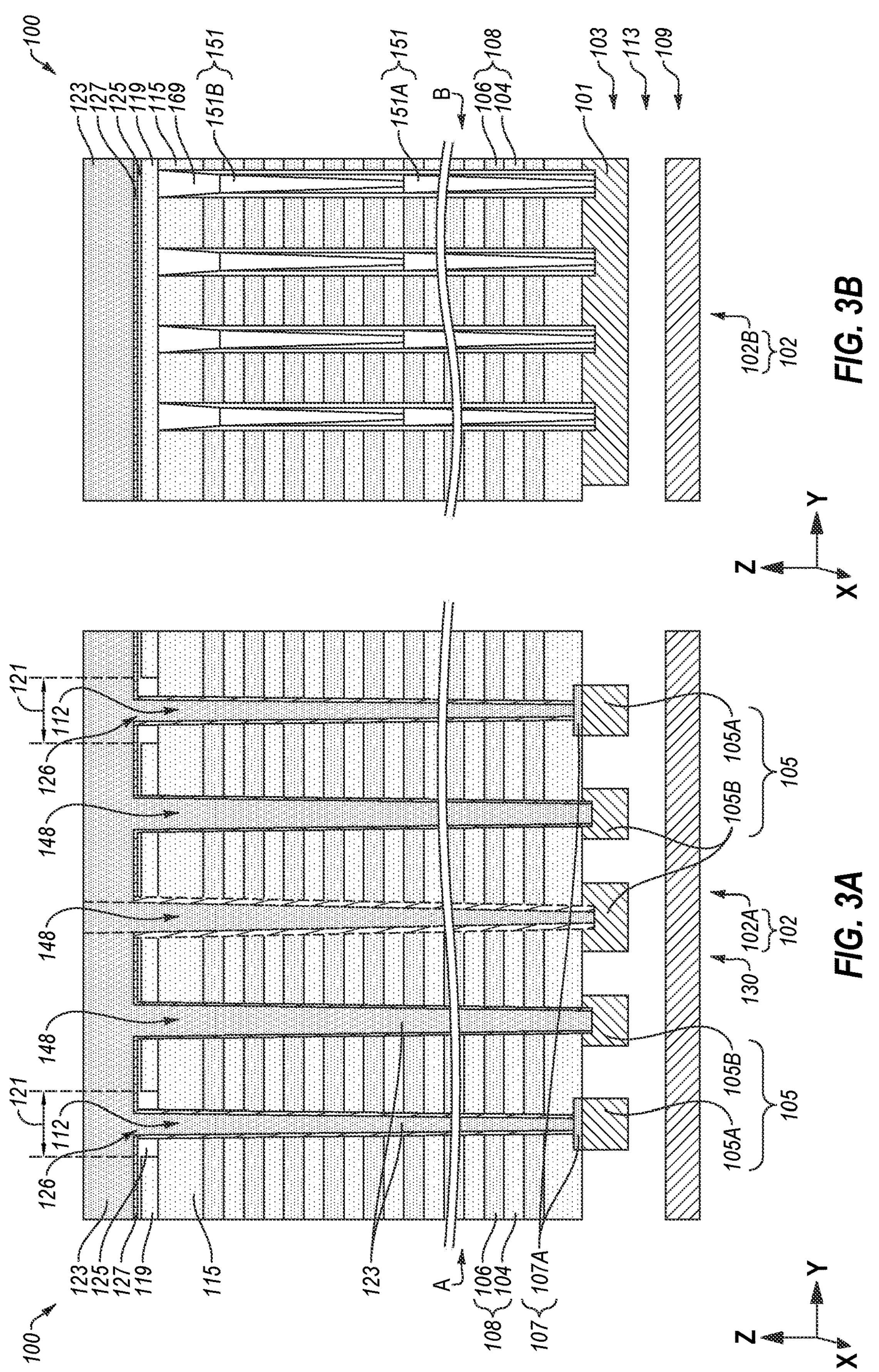
FIG. 3A is a simplified, longitudinal cross-sectional view of a portion of the microelectronic device structure shown in FIG. 2A at another processing stage.
FIG. 3B is a simplified, longitudinal cross-sectional view of the portion of the microelectronic device structure shown in FIG. 2B at the processing stage of FIG. 3A.

FIG. 3A is a simplified, longitudinal cross-sectional view of the portion A of the microelectronic device structure 100 shown in FIG. 2A at another processing stage of the method of forming the microelectronic device following the processing stage of FIGS. 2A and 2B. FIG. 3B is a simplified, longitudinal cross-sectional view of the portion B of the microelectronic device structure 100 shown in FIG. 2B at the processing stage of FIG. 3A. Referring to FIG. 3A, a dielectric cap material 125 is first formed on upper surfaces of the masking material 119, and also in the first openings 126 (FIG. 2A) that were formed in the masking material 119, including upon the isolation material 115 that is exposed through the first openings 126 in the masking material 119. Further referring to FIG. 3A, slots 112 are formed at the slot areas 111 (e.g., FIG. 2A) and contact openings 148 may be formed (e.g., substantially simultaneously formed) between slots 112, where the contact openings 148 vertically extend through the masking material 119, the isolation material 115, and the preliminary stack structure 102. As illustrated, three occurrences of the contact openings 148 are depicted, and the center contact opening 148 may be in a plane in front of the Y-Z plane of the drawing, and hence, the structures related to the center contact opening 148 may be illustrated in dashed lines throughout the disclosure. The slots 112 and the contact openings 148 may terminate at or beyond the etch stop structures 107 within the source tier 103. In some embodiments, the slots 112 are formed to extend to and terminate at or within the etch stop structures 107A. In an embodiment, no contact second etch stop structures 107B (FIG. 1A) are employed, and the contact openings 148 may vertically extend to and terminate at or within the second discrete conductive structures 105B of the source tier 103. With the formation of the slots 112, the preliminary block areas 110, illustrated in FIGS. 1 and 2A, are further defined as preliminary blocks 130 that are between two slots 112, where the preliminary blocks 130 are regions in the preliminary tiers 108, between two slots 112 within the distributed staircase region 102A of the preliminary stack structure 102.

As shown in FIG. 3A, the slots 112 may be horizontally aligned with the openings 126 formed in the masking material 119, and the contact openings 148 may be horizontally interposed between the slots 112. Horizontal widths of the slots 112 in the Y-direction may be less than the first opening width 121 of the openings 126 formed in the masking material 119, such that portions of the dielectric cap material 125 horizontally intervene between the slots 112 and the remaining portions of the masking material 119. In addition, as shown in FIG. 3A, the contact openings 148 may be formed to horizontally extend from and between the sidewalls of the masking material 119. Put another way, the dielectric cap material 125 may not horizontally intervene between the contact openings 148 and the remaining portions of the masking material 119.

Still referring to FIG. 3A, following the formation of the slots 112 and the contact openings 148, a first liner material 127 may be formed on or over exposed surfaces of the microelectronic device structure 100 inside and outside of boundaries of the slots 112 and the contact openings 148, and then a first sacrificial material 123 may formed on or over the first liner material 127. The first liner material 127 and the first sacrificial material 123 may together substantially fill the slots 112 and the contact openings 148, and may also extend outside of the boundaries of the slots 112 and the contact openings 148.

The first liner material 127 may be formed to extend continuously across surfaces inside and outside of the slots 112 and the contact openings 148. The first liner material 127 may be employed as a barrier material between the materials of the tiers 108 and the first sacrificial material 123. The first liner material 127 may be formed of and include at least one conductive nitride material. In some embodiments, the first liner material 127 is formed of and includes a metal nitride material, $TiN_x$.

The first sacrificial material 123 may be formed to extend continuously across surfaces of the first liner material 127 inside and outside of the slots 112 and the contact openings 148. The first sacrificial material 123 may formed of and include at least one material that may be selectively exhumed relative to other materials of the microelectronic device structure 100 during mutual exposure to at least one etchant, as described in further detail below. In some embodiments, the first sacrificial material 123 is formed of and includes polycrystalline silicon.

Figures 4A, 4B:
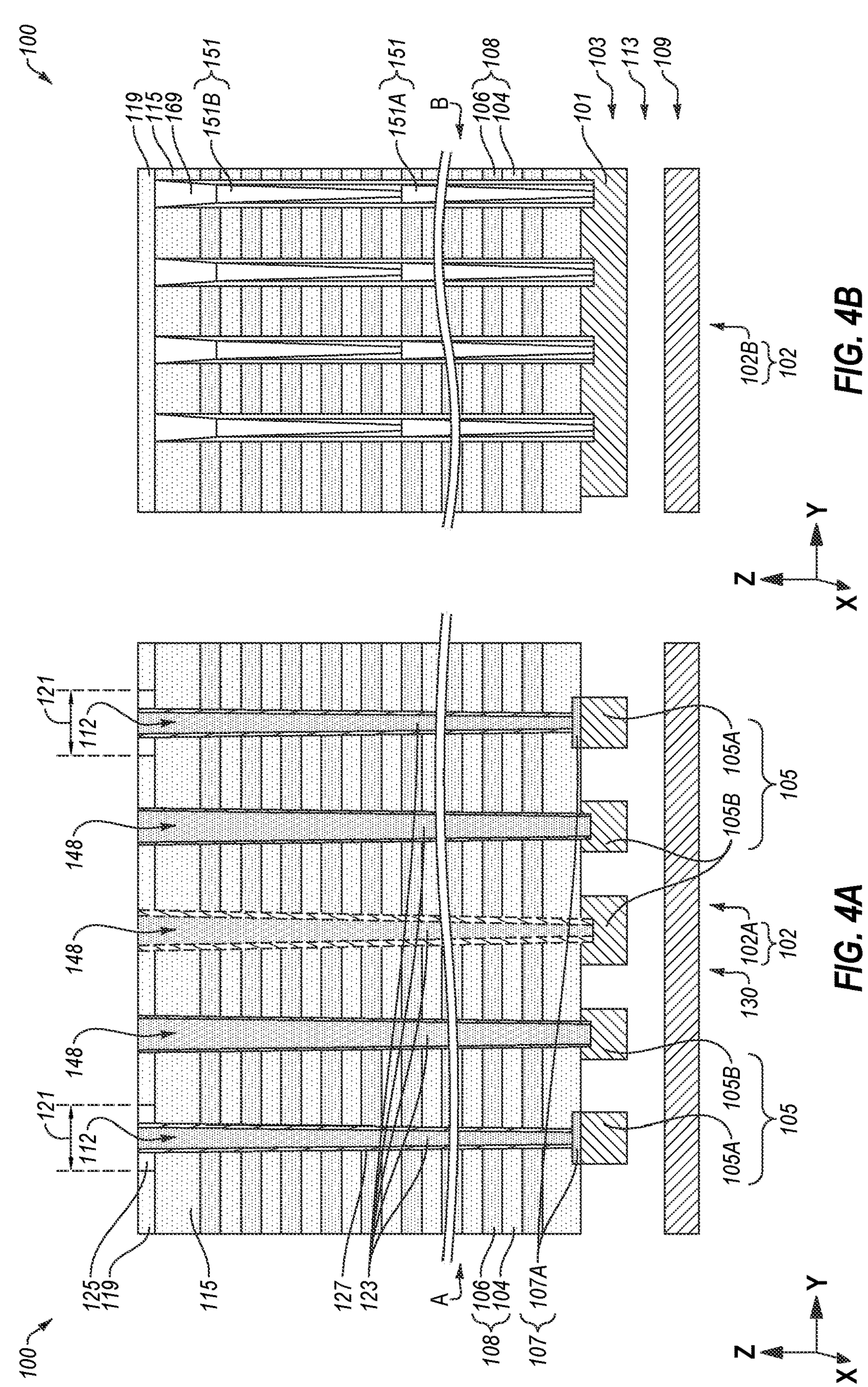
FIG. 4A is a simplified, longitudinal cross-sectional view of a portion of the microelectronic device structure shown in FIG. 3A at another processing stage.
FIG. 4B is a simplified, longitudinal cross-sectional view of the portion of the microelectronic device structure shown in FIG. 3B.

FIG. 4A is a simplified, longitudinal cross-sectional view of the portion A of the microelectronic device structure 100 shown in FIG. 3A at another processing stage of the method of forming the microelectronic device following the processing stage of FIGS. 3A and 3B. FIG. 4B is a simplified, longitudinal cross-sectional view of the portion B of the microelectronic device structure 100 shown in FIG. 3B at the processing stage of FIG. 4A. Referring collectively to FIGS. 4A and 4B, portions of the first sacrificial material 123, the dielectric cap material 125, and the first sacrificial material 123 overlying upper vertical boundaries of the masking material 119 may be removed. The first sacrificial material 123, the dielectric cap material 125 (FIGS. 3A and 3B), and the first liner material 127 may be removed from an upper surface of the masking material 119 by a technique such as CMP that also may incrementally remove more of the masking material 119, and the thickness (Z-height) may be less than that of the masking material 119 depicted in FIGS. 3A and 3B. The first liner material 127 remains within the slots 112 and the contact openings 148. In an embodiment, a wet nitride strip (WNS) is performed to substantially remove all of the first liner material 127 from the upper surface of the masking material 119, to eliminate nitride residue. Other processing may be done to substantially remove all of the first liner material 127 from the current upper surface of the masking material 119. As a result of processing, the masking material 119 may be reduced in thickness (Z-direction) such that the thickness (Z-direction) of the masking material 119 depicted in FIGS. 4A and 4B is less than that depicted in FIGS. 3A and 3B. In an embodiment, the masking material 119 has been reduced in thickness less than or equal to about 10 nm.

Figures 5A, 5B:
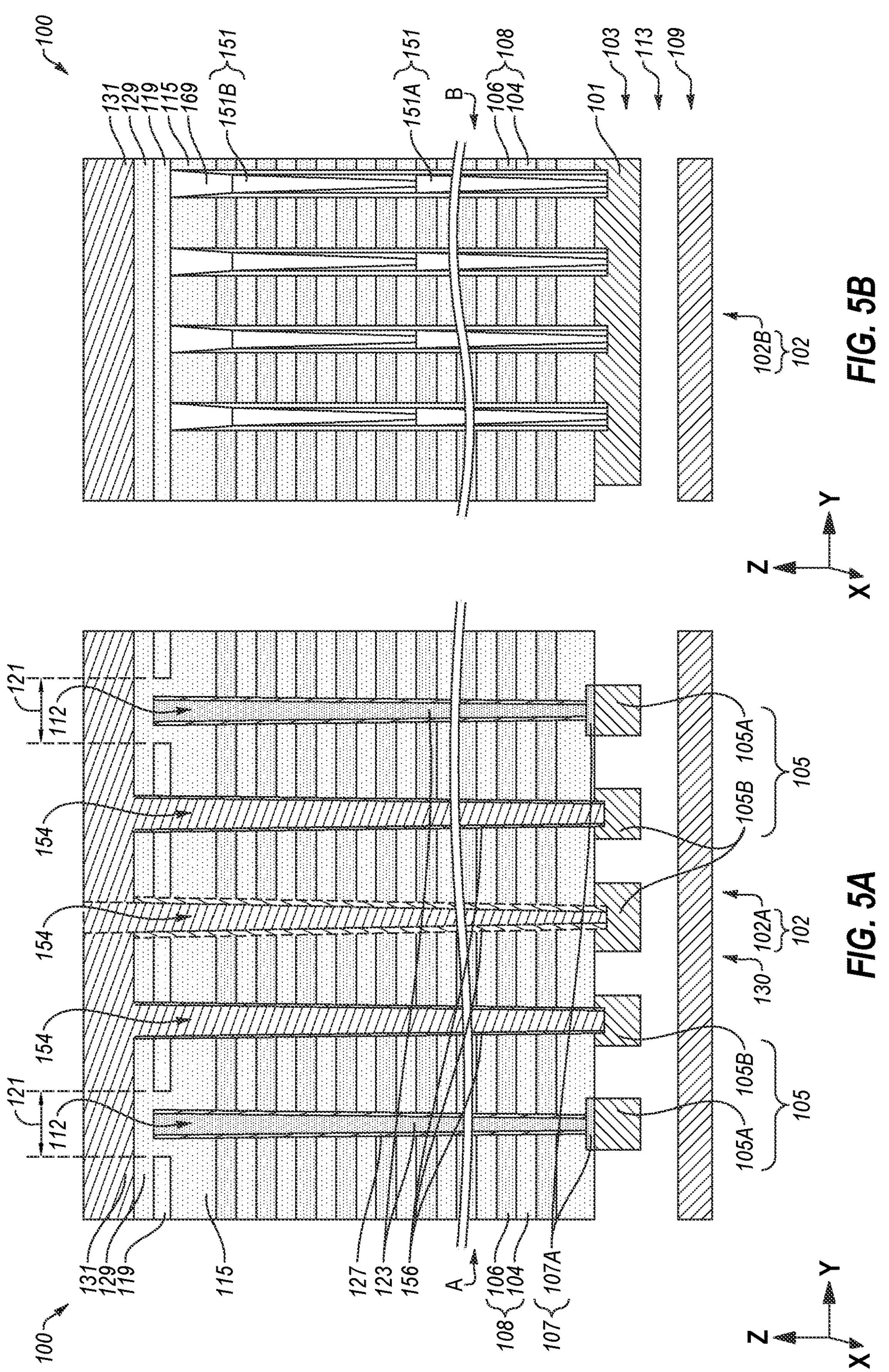
FIG. 5A is a simplified, longitudinal cross-sectional view of a portion of the microelectronic device structure shown in FIG. 4A at another processing stage.
FIG. 5B is a simplified, longitudinal cross-sectional view of the portion of the microelectronic device structure shown in FIG. 4B at the processing stage of FIG. 5A.

FIG. 5A is a simplified, longitudinal cross-sectional view of the portion A of the microelectronic device structure 100 shown in FIG. 4A at another processing stage of the method of forming the microelectronic device following the processing stage of FIGS. 4A and 4B. FIG. 5B is a simplified, longitudinal cross-sectional view of the portion B of the microelectronic device structure 100 shown in FIG. 4B at the processing stage of FIG. 5A. Referring collectively to FIGS. 5A and 5B, additional dielectric cap material 129 is formed on or over exposed surfaces of the first sacrificial material 123, the dielectric cap material 125, the first liner material 127, and the masking material 119. Thereafter, portions of the additional dielectric cap material 129 overlying and within horizontal areas of the contact openings 148 (FIG. 4A) are removed, and portions of the first sacrificial material 123 and the first liner material 127 within the in the contact openings 148 (FIG. 4A) are exhumed. Thereafter, a contact second liner material 156 is formed on or over exposed surfaces inside and outside of the newly re-formed contact openings 148 (FIG. 4A), a directional etch is effectuated to remove the second liner material 156 from the bottoms of the contact openings 148 (FIG. 4A) to expose the at the second discrete conductive structures 105B within the source tier 103. Thereafter, a contact structure material 131 is formed inside and outside of the contact openings 148. The contact structure material 131 may substantially fill remaining portions of the contact openings 148. In some embodiments, the additional dielectric cap material 129 is formed of and includes dielectric oxide material (e.g., $SiO_x$, such as $SiO_2$), the second liner material 156 is formed of and includes additional dielectric material (e.g., additional dielectric oxide material, such as additional $SiO_x$), and the contact structure material 131 is formed of and includes conductive material (e.g., a metal material, such as one or more of W, Ti, and $TiN_x$).

Figures 6A, 6B:
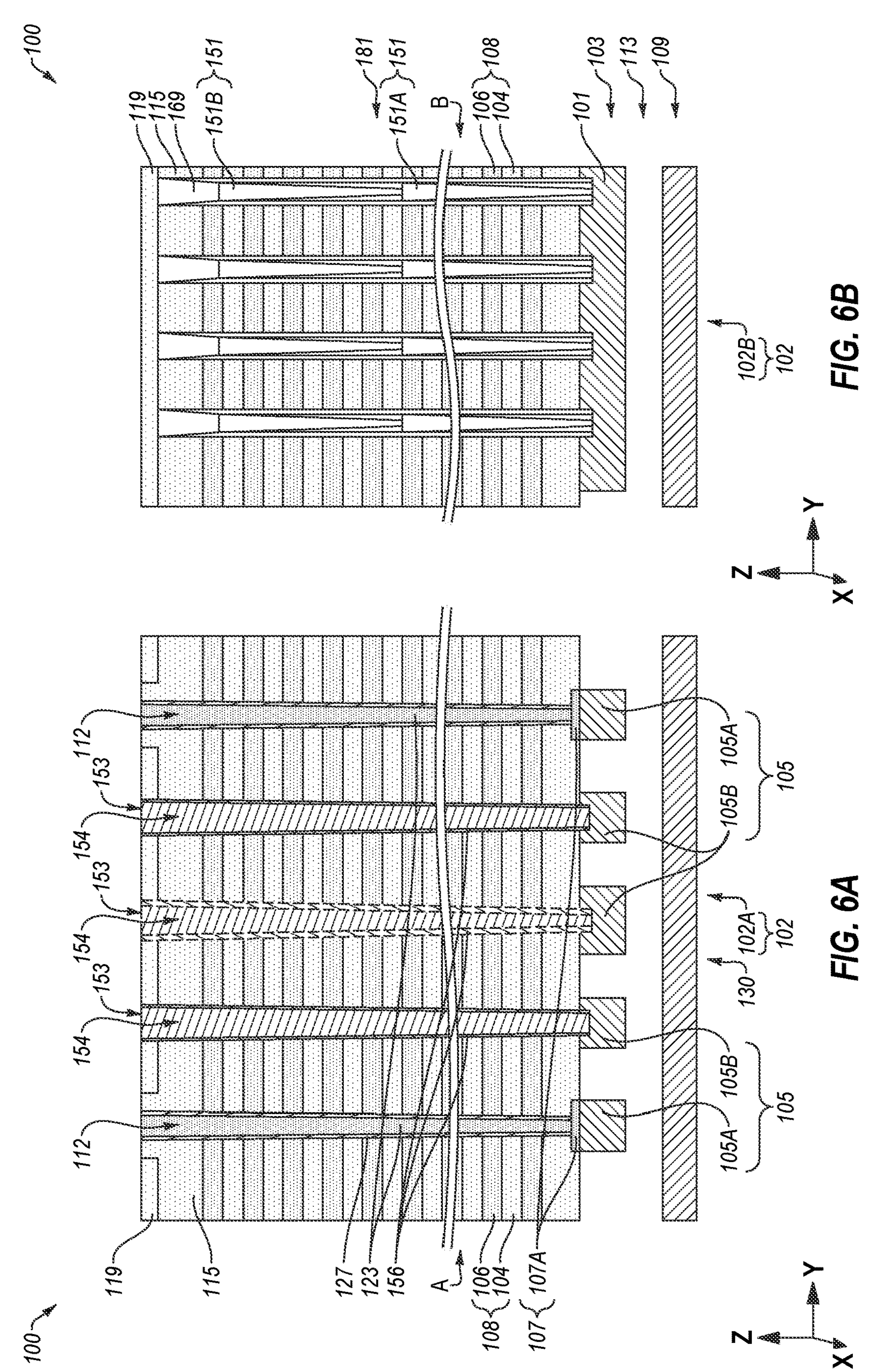
FIG. 6A is a simplified, longitudinal cross-sectional view of a portion of the microelectronic device structure shown in FIG. 5A at another processing stage.
FIG. 6B is a simplified, longitudinal cross-sectional view of the portion of the microelectronic device structure shown in FIG. 5B at the processing stage of FIG. 6A.

FIG. 6A is a simplified, longitudinal cross-sectional view of the portion A of the microelectronic device structure 100 shown in FIG. 5A at another processing stage of the method of forming the microelectronic device following the processing stage of FIGS. 5A and 5B. FIG. 6B is a simplified, longitudinal cross-sectional view of the portion B of the microelectronic device structure 100 shown in FIG. 5B at the processing stage of FIG. 6A. Referring collectively to FIGS. 6A and 6B, portions of the contact structure material 131 (FIGS. 5A and 5B) overlying upper vertical boundaries of the masking material 119, while retaining additional portions of the contact structure material 131 overlying the upper vertical boundaries of the masking material 119 to form contact structures 154. In an embodiment, the additional dielectric cap material 129 (FIGS. 5A and 5B) is also completely removed, and a portion of the masking material 119 is also partially removed such that the thickness (Z-height) of the remaining portion of the masking material 119 as depicted, is thinner than that of the masking material 119 depicted in FIGS. 5A and 5B.

In an embodiment, a first CMP process is used to remove the contact structure material 131 above the masking material 119, and a second CMP process (e.g., an oxide buffered CMP process) is used to remove the additional dielectric cap material 129 above the masking material 119. In an embodiment, the additional dielectric cap material 129 (not pictured) is not completely removed such that the masking material 119 as depicted, is the same thickness as the masking material 119 depicted in FIGS. 5A and 5B. By processing accomplished and with structures illustrated in FIGS. 6A and 6B, a top surface 153 (e.g., upper surface) of the contact structures 154 is at substantially coplanar with a top surface of the remaining portion of the masking material 119.

Figure 7:
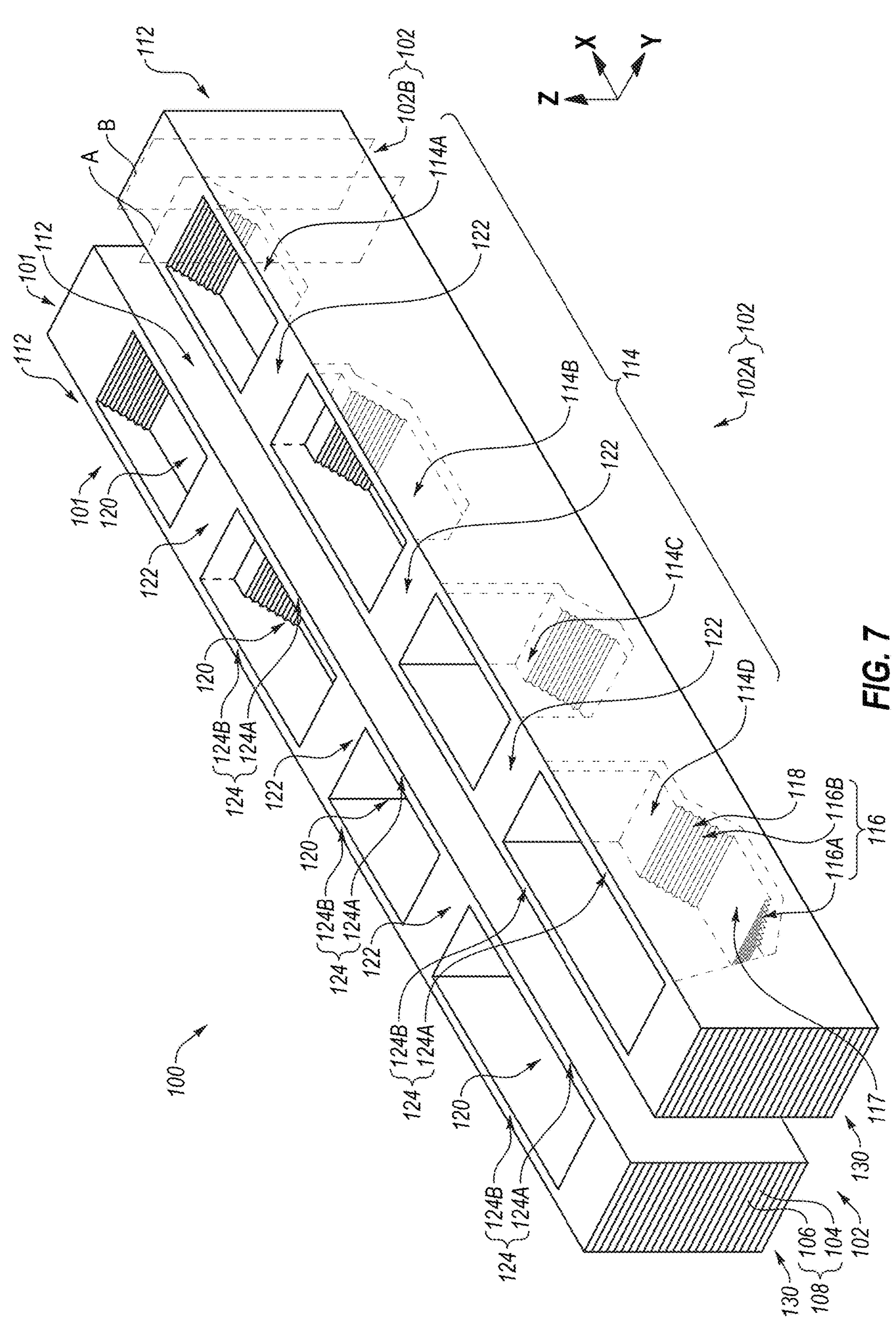
FIG. 7 is a simplified, partial perspective view of the microelectronic device structure shown in FIG. 1 at another processing stage.
Figures 7A, 7B:
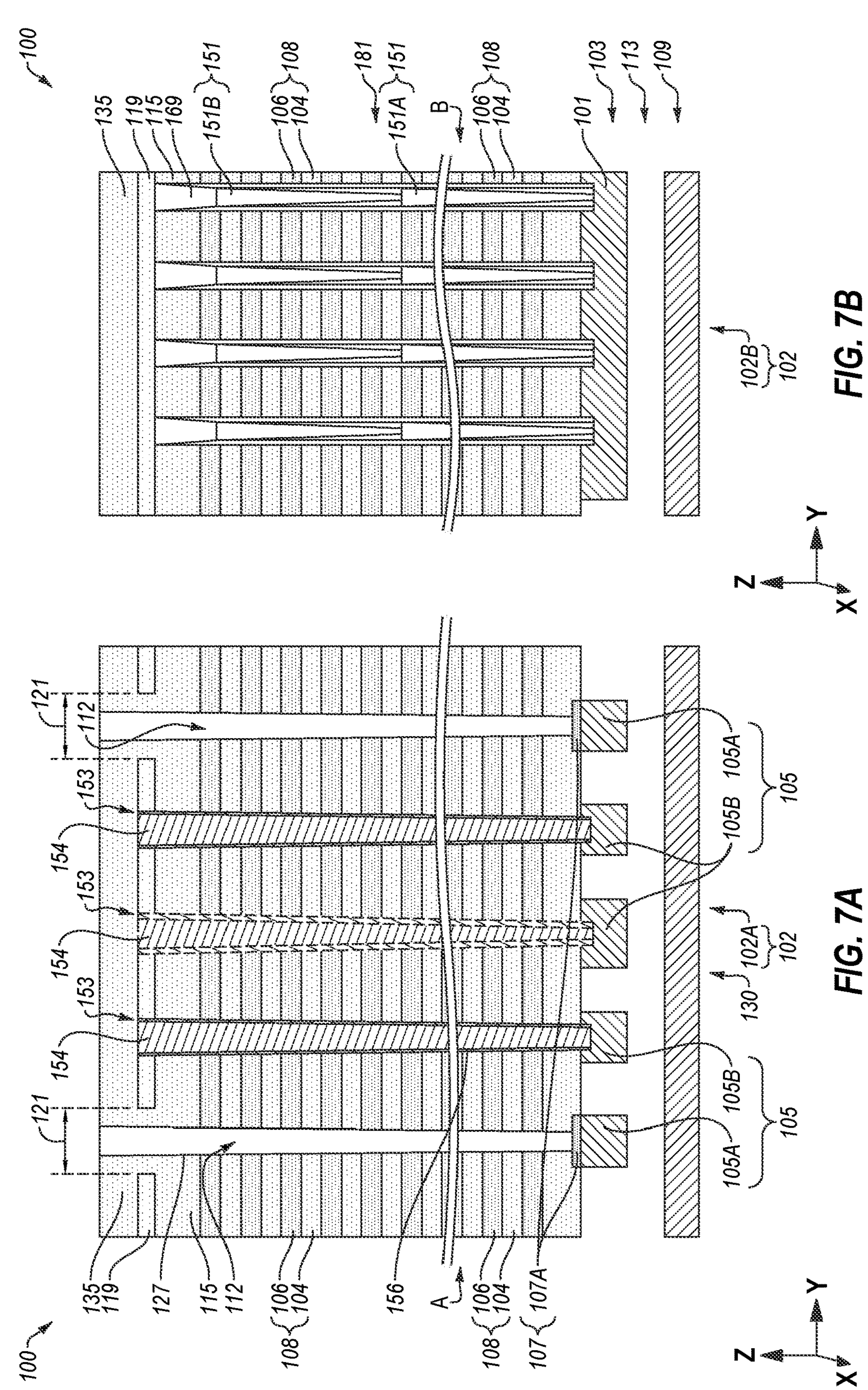
FIG. 7A is a simplified, longitudinal cross-sectional view of a portion of the microelectronic device structure shown in FIG. 6A at the processing stage of FIG. 7.
FIG. 7B is a simplified, longitudinal cross-sectional view of the portion of the microelectronic device structure shown in FIG. 6B at the processing stage of FIG. 7.

FIG. 7 is a simplified, partial perspective view of the microelectronic device structure 100 shown in FIG. 1 at another processing stage of the method of forming the microelectronic device following the processing stage of FIGS. 6A and 6B. FIG. 7A is a simplified, longitudinal cross-sectional view of the portion A of the microelectronic device structure 100 shown in FIG. 6A at the processing stage of FIG. 7. FIG. 6B is a simplified, longitudinal cross-sectional view of the portion B of the microelectronic device structure 100 shown in FIG. 6B at the processing stage of FIG. 7. Referring collectively to FIGS. 7, 7A, and 7B, the first sacrificial material 123 (FIG. 6A) and first liner material 127 (e.g., FIG. 6A) may be selectively removed from within the slots 112 (FIG. 6A). As shown in FIGS. 7A and 7B, a further dielectric cap oxide material 135 (e.g., further dielectric oxide material, such as further $SiO_x$) may be formed over exposed surfaces of the microelectronic device structure 100 resulting from the processing stage of FIGS. 6A and 6B, the further dielectric cap oxide material 135 may be patterned to remove portions thereof overlying and within horizontal areas of the slots 112, and then the first sacrificial material 123 (FIG. 6A) and the first liner material 127 (e.g., FIG. 6A) may be substantially exhumed from the slots 112.

Figures 8A, 8B:
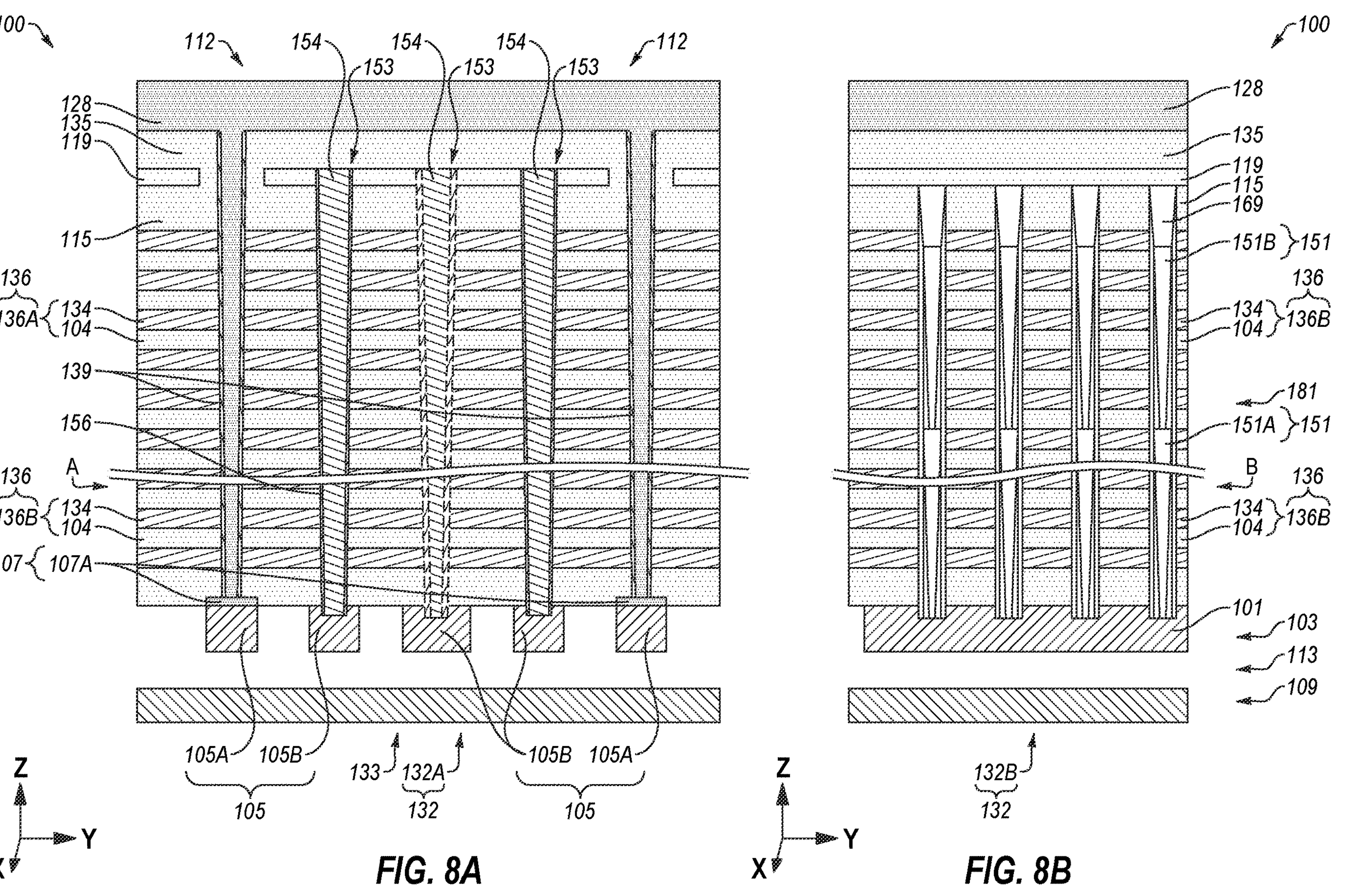
FIG. 8A is a simplified, longitudinal cross-sectional view of a portion of the microelectronic device structure shown in FIG. 7A at another processing stage.
FIG. 8B is a simplified, longitudinal cross-sectional view of the portion of the microelectronic device structure shown in FIG. 7B at the processing stage of FIG. 8A.

FIG. 8A is a simplified, longitudinal cross-sectional view of the portion A of the microelectronic device structure 100 shown in FIG. 7A at another processing stage of the method of forming the microelectronic device following the processing stage of FIGS. 7, 7A, and 7B. FIG. 8B is a simplified, longitudinal cross-sectional view of the portion B of the microelectronic device structure 100 shown in FIG. 7B at the processing stage of FIG. 8A. Referring collectively to FIGS. 8A and 8B, the microelectronic device structure 100 may be subjected to replacement-gate processing to replace the sacrificial material 106 (e.g., FIG. 7A) of the tiers 108 (e.g., FIG. 7A) within conductive material 134. Further, the replacement-gate processing may form a stack structure 132 from the preliminary stack structure 102 (e.g., FIGS. 1 through 7A), the stack structure 132 including blocks 133 formed from the preliminary block structures 130 (FIGS. 7 and 7A) and separated from one another by the slots 112. Following the replacement-gate processing, the slots 112 are filled with material, as described in further detail below.

As shown in FIG. 8A, the stack structure 132 may include a vertically alternating (e.g., in the Z-direction) sequence of remaining portions of the insulative material 104 and the conductive material 134 arranged in tiers 136. The stack structure 132 may be divided into the blocks 133, and the shapes and dimensions of the blocks 133 may be substantially the same as the shapes and dimensions of the preliminary block structures 130 (FIGS. 7 and 7A) of the preliminary stack structure 102 (FIGS. 7 and 7A) previously described herein.

The conductive material 134 of the tiers 136 of the stack structure 132 may be formed of and include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive material 134 is formed of and includes tungsten (W). Optionally, at least one liner material (e.g., at least one insulative liner material, at least one conductive liner materials) may be formed around the conductive material 134. The liner material may, for example, be formed of and include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material for the formation of the conductive material 134. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the tiers 136 of the stack structure 132, $AlO_x$, (e.g., $Al_2O_3$) may be formed directly adjacent the insulative material 104, $TiN_x$ (e.g., TiN) may be formed directly adjacent the $AlO_x$, and W may be formed directly adjacent the $TiN_x$. For clarity and ease of understanding the description, the liner material is not illustrated in FIG. 7B, but it will be understood that the liner material may be disposed around the conductive material 134. Within each block 133 of the stack structure 132, the conductive material 134 of one or more relatively vertically higher tier(s) 136A (e.g., upper tiers) may be employed to form upper select gate structures (e.g., drain side select gate (SGD) structures) for upper select transistors (e.g., drain side select transistors) of the block 133, as described in further detail below. The conductive material 134 of relatively vertically higher tier(s) 136A may be segmented by one or more filled slot(s) (e.g., filled SGD slot(s)) to form the upper select gate structures of the block 133, as also described in further detail below. In some embodiments, within each block 133 of the stack structure 132, the conductive material 134 of each of less than or equal to eight (8) relatively higher tier(s) 136A (e.g., from one (1) relatively vertically higher tier 136A to eight (8) relatively vertically higher tiers 136A) of the stack structure 132 is employed to form upper select gate structures (e.g., SGD structures) for the block 133. In addition, within each block 133 of the stack structure 132, the conductive material 134 of at least some relatively vertically lower tiers 136B vertically underlying the relatively vertically higher tier(s) 136A may be employed to form access line structures (e.g., word line structures) of the block 133, as also described in further detail below. Moreover, within each block 133 of the stack structure 132, the conductive material 134 of at least a vertically lowest tier 136 may be employed to form as at least one lower select gate structure (e.g., at least one source side select gate (SGS) structure) for lower select transistors (e.g., source side select transistors) of the block 133, as also described in further detail below.

Referring to FIG. 8B, within the array regions 132B of the stack structure 132, intersections of the pillar structures 151 (e.g., the lower pillar structures 151A, the upper pillar structures 151B) and the conductive material 134 of some of the tiers 136 (e.g., access line tiers, word line tiers) of the stack structure 132 may define vertically extending strings of memory cells 181 coupled in series with one another within individual blocks 133 of the stack structure 132. In some embodiments, the memory cells 181 formed at the intersections of the conductive material 104 of some of the tiers 136 (e.g., access line tiers) and the pillar structures 151 comprise so-called “MONOS” (metal-oxide-nitride-oxide-semiconductor) memory cells. In additional embodiments, the memory cells 181 comprise so-called “TANOS” (tantalum nitride-aluminum oxide-nitride-oxide-semiconductor) memory cells, or so-called “BETANOS” (band/barrier engineered TANOS) memory cells, each of which are subsets of MONOS memory cells. In further embodiments, the memory cells 181 comprise so-called “floating gate” memory cells including floating gates (e.g., metallic floating gates) as charge storage structures. The floating gates may horizontally intervene between central structures of the pillar structures 151 and the conductive material 104 of some of the tiers 136 of the stack structure 132. The vertically extending strings of memory cells 181 together form at least one memory array within an individual block 133 of the stack structure 132. In addition, intersections of the pillar structures 151 and the conductive material 104 of some other of the tiers 136 (e.g., select gate tiers) of the blocks 133 may define select transistors (e.g., select gate drain (SGD) transistors, select gate source (SGS) transistors) coupled in series with the vertically extending strings of memory cells 181. In some embodiments, the select transistors comprise metal-oxide-semiconductor (MOS) transistors.

Referring collectively to FIGS. 8A and 8B, the replacement gate processing employed to form the stack structure 132 may include treating the microelectronic device structure 100 with at least one wet etchant formulated to selectively remove portions of the sacrificial material 106 (e.g., FIGS. 7, 7A, and 7B) of the tiers 108 (FIGS. 7, 7A, and 7B) of the preliminary stack structure 102 (FIGS. 7, 7A, and 7B). The wet etchant may be selected to remove the portions of the sacrificial material 106 (FIGS. 7, 7A, and 7B) without substantially removing portions of the insulative material 104 of the tiers 108 (FIGS. 7, 7A, and 7B) of the preliminary stack structure 102 (FIGS. 7, 7A, and 7B). In some embodiments, the sacrificial material 106 (FIGS. 7, 7A, and 7B) comprises a dielectric nitride material (e.g., $SiN_y$, such as $Si_3N_4$) and the insulative material 104 comprises a dielectric oxide material (e.g., $SiO_x$, such as $SiO_2$), and the sacrificial material 106 (FIGS. 7, 7A, and 7B) of the tiers 108 (FIGS. 7, 7A, and 7B) of the preliminary stack structure 102 (FIGS. 7, 7A, and 7B) is selectively removed using a wet etchant comprising $H_3PO_4$. Following the selective removal of the portions of the sacrificial material 106 (FIGS. 7, 7A, and 7B), the resulting recesses may be filled with the conductive material 134 to form the stack structure 132 (including the tiers 136 and the blocks 133 thereof).

Still referring to FIGS. 8A and 8B, following the formation of the stack structure 132, slots 112 (FIG. 7A) may be filled with one or more materials. For example, a third liner material 139 may be formed inside and outside of the slots 112, and then fill material 128 may be formed on or over the third liner material 139 inside and outside of the slots 112. In some embodiments, the third liner material 139 is formed of and includes insulative material, such as dielectric oxide material (e.g., $SiO_x$, such as $SiO_2$). In an embodiment, the third liner material 139 is not formed. In addition, the fill material 128 may be formed of and include one or more of an insulative material and a semiconductive material (also referred to herein as a "semi-insulative material"). In some embodiments, the fill material 128 is formed of and includes polycrystalline silicon. In additional embodiments, the fill material 128 is formed of and includes dielectric oxide material, such as $SiO_x$, (e.g., $SiO_2$).

Figures 9A, 9B:
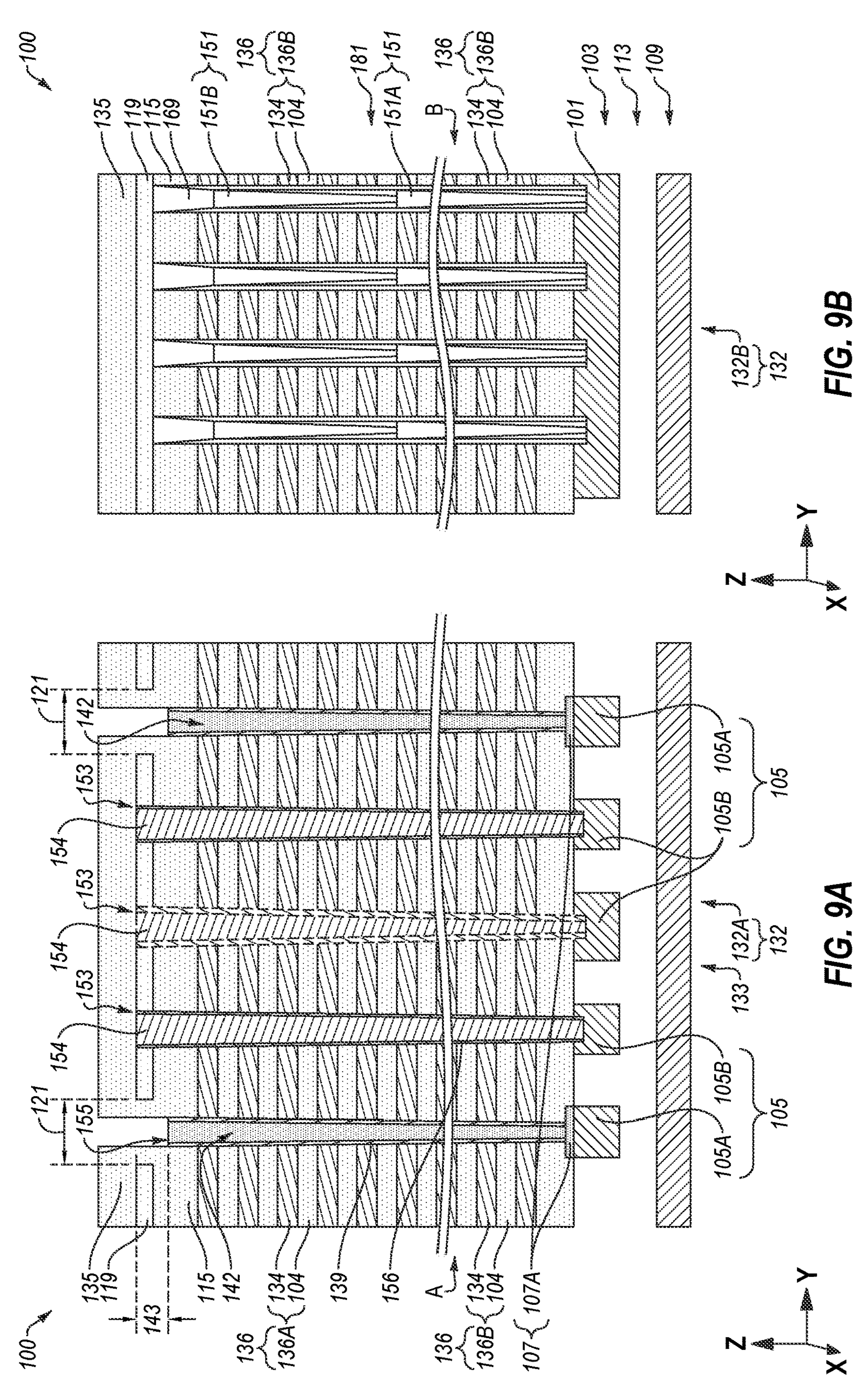
FIG. 9A is a simplified, longitudinal cross-sectional view of a portion of the microelectronic device structure shown in FIG. 8A at another processing stage.
FIG. 9B is a simplified, longitudinal cross-sectional view of the portion of the microelectronic device structure shown in FIG. 8B at the processing stage of FIG. 9A.

FIG. 9A is a simplified, longitudinal cross-sectional view of the portion A of the microelectronic device structure 100 shown in FIG. 8A at another processing stage of the method of forming the microelectronic device following the processing stage of FIGS. 8A and 8B. FIG. 9B is a simplified, longitudinal cross-sectional view of the portion B of the microelectronic device structure 100 shown in FIG. 8B at the processing stage of FIG. 9A. Referring collectively to FIGS. 9A and 9B, portions (e.g., upper portions) of at least the fill material 128 (FIGS. 8A and 8B) are removed to form filled slot structures 142 substantially confined within boundaries of the slots 112 (FIGS. 7 and 7A). The material removal process may remove portions of the fill material 128 (FIGS. 8A and 8B) on or over an upper boundary (e.g., an upper surface) of the third cap oxide material 135, and well as portions of the fill material 128 (FIGS. 8A and 8B) within upper portions of the slots 112 (FIGS. 7 and 7A). Upper boundaries of the filled slot structures 142 may be below lower boundaries of the masking material 119 and above upper boundaries of the stack structure 132. In an embodiment, a recess depth 143 of upper surfaces of the filled slot structures 142 below an upper boundary of the masking material 119, is within a range from 100 nm to about 200 nm. In an embodiment, the recess depth 143 is a larger than the thickness (Z-direction) of the masking material 119 depicted in FIG. 9A, within a ratio range of from about 3:1 to about 6:1. By achieving a useful recess depth 143 of the filled slot structures 142, a subsequent planarization process of a given oxide such as the third cap oxide material 135, will be useful to prevent interfering interaction with the material of the filled slot structures 142, causing less than useful interactions in the CMP process during removal of the third cap oxide material 135. In an embodiment, the masking material 119 as previously patterned above the filled slot structures 142 have the first opening width 121 that has lateral dimension in the first direction (Y-direction) and the filled slot structures 142 have a lateral dimension in the first direction (Y-direction) that is less than the first opening width 121. Put another way, the filled slot structures 142 have a first dimension at an upper extent thereof that is less than the first opening widths 121 exhibited by the masking material 119.

Figures 10A, 10B:
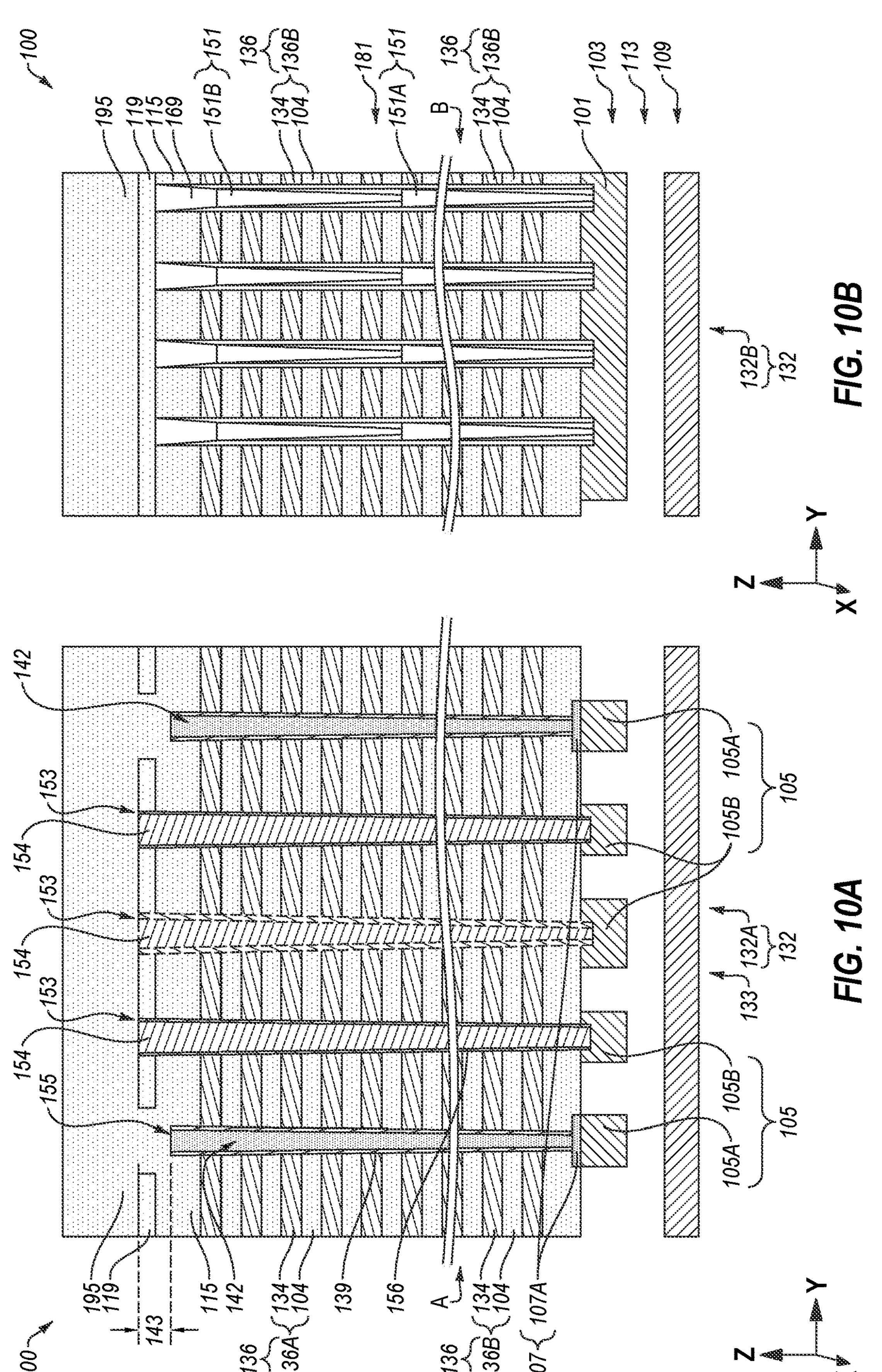
FIG. 10A is a simplified, longitudinal cross-sectional view of a portion of the microelectronic device structure shown in FIG. 9A at another processing stage.
FIG. 10B is a simplified, longitudinal cross-sectional view of the portion of the microelectronic device structure shown in FIG. 9B at the processing stage of FIG. 10A.

FIG. 10A is a simplified, longitudinal cross-sectional view of the portion A of the microelectronic device structure 100 shown in FIG. 9A at another processing stage of the method of forming the microelectronic device following the processing stage of FIGS. 9A and 9B. FIG. 10B is a simplified, longitudinal cross-sectional view of the portion B of the microelectronic device structure 100 shown in FIG. 9B at the processing stage of FIG. 10A. Referring collectively to FIGS. 10A and 10B, a fourth dielectric cap material 195 may be formed (e.g., non-conformally formed) on or over exposed surfaces of the microelectronic device structure 100. The fourth dielectric cap material 195 may substantially fill the upper portions of the slots 112 (FIGS. 7 and 7B) unoccupied by the filled slot structures 142. An upper boundary of the fourth dielectric cap material 195 may be formed (e.g., by way of CMP processing following deposition) to be substantially planar.

The fourth dielectric cap material 195 may be formed of and include at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$). In some embodiments, the fourth dielectric cap material 195 is formed of and includes $SiO_2$. In some embodiments, the fourth dielectric cap material 195 comprises dielectric oxide material formed through a CVD process employing tetraethoxysilane (TEOS) as a precursor. Such a dielectric oxide material is also referred to herein as a TEOS oxide. In additional embodiments, the fourth dielectric cap material 195 comprises dielectric oxide material formed through high aspect ratio process (HARP). Such a dielectric oxide material is also referred to herein as a HARP oxide.

Figures 11A, 11B:
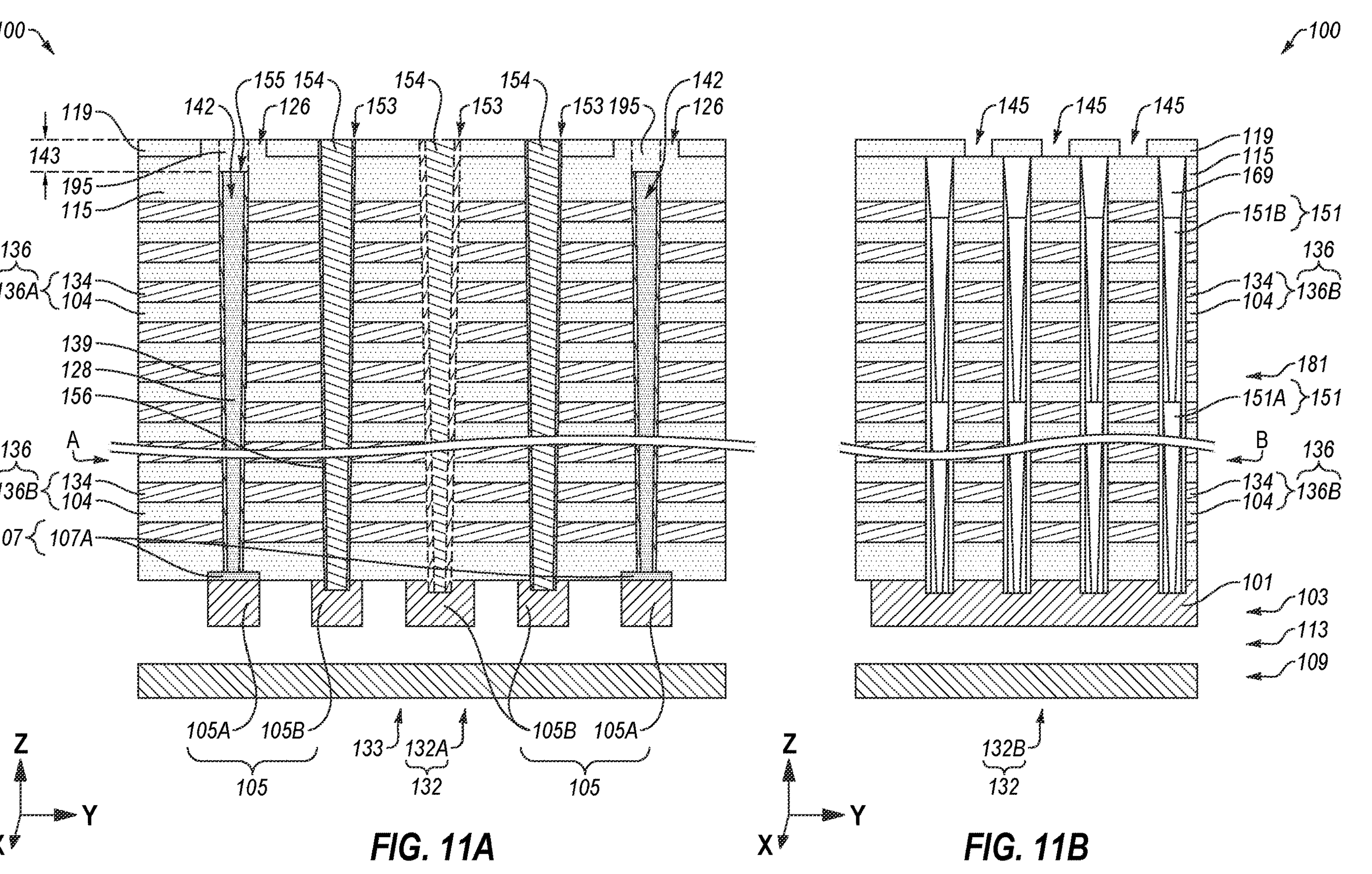
FIG. 11A is a simplified, longitudinal cross-sectional view of a portion of the microelectronic device structure shown in FIG. 10A at another processing stage.
FIG. 11B is a simplified, longitudinal cross-sectional view of the portion of the microelectronic device structure shown in FIG. 10B at the processing stage of FIG. 11A.

FIG. 11A is a simplified, longitudinal cross-sectional view of the portion A of the microelectronic device structure 100 shown in FIG. 10A at another processing stage of the method of forming the microelectronic device following the processing stage of FIGS. 10A and 10B. FIG. 11B is a simplified, longitudinal cross-sectional view of the portion B of the microelectronic device structure 100 shown in FIG. 10B at the processing stage of FIG. 11A. Referring collectively to FIGS. 11A and 11B, a portion (e.g., an upper portion) of the fourth dielectric cap material 195 may be removed (e.g., by way of CMP processing) to expose an upper surface of the masking material 119. The removal process may also remove a portion of the masking material 119, such that the thickness (Z-height) of a remaining portions of the masking material 119 depicted in FIGS. 11A and 11B is less than that of the masking material 119 depicted in FIGS. 10A and 10B. A remaining portion of the fourth dielectric cap material 195 may be positioned above the upper surfaces of the filled slot structures 142. The remaining portion of the fourth dielectric cap material 195 may having lateral (Y-direction) boundaries corresponding to the lateral dimensions of the filled slot structures 142 at the highest vertical (Z-direction) extent where the filled slot structures 142.

Referring to FIG. 11B, following exposure of the upper surface of the masking material 119, additional openings 145 (in addition to the first openings 126) may be formed to extend through the masking material 119. The additional openings 145 may be positioned within horizontal areas of the blocks 133 of the stack structure 132, and may extend in parallel with the filled slot structures 142. Portions of the additional openings 145 may be positioned within a horizontal area of the distributed staircase region 102A and the stack structure 132, and additional portions of the additional openings 145 may be positioned within a horizontal area of the array region 102B and the stack structure 132. As shown in FIG. 11B, the additional openings 145 in the masking material 119 may be formed to be horizontally interposed between groups (e.g., rows) of the pillar structures 151 horizontally neighboring one another in the Y-direction.

Figures 12A, 12B:
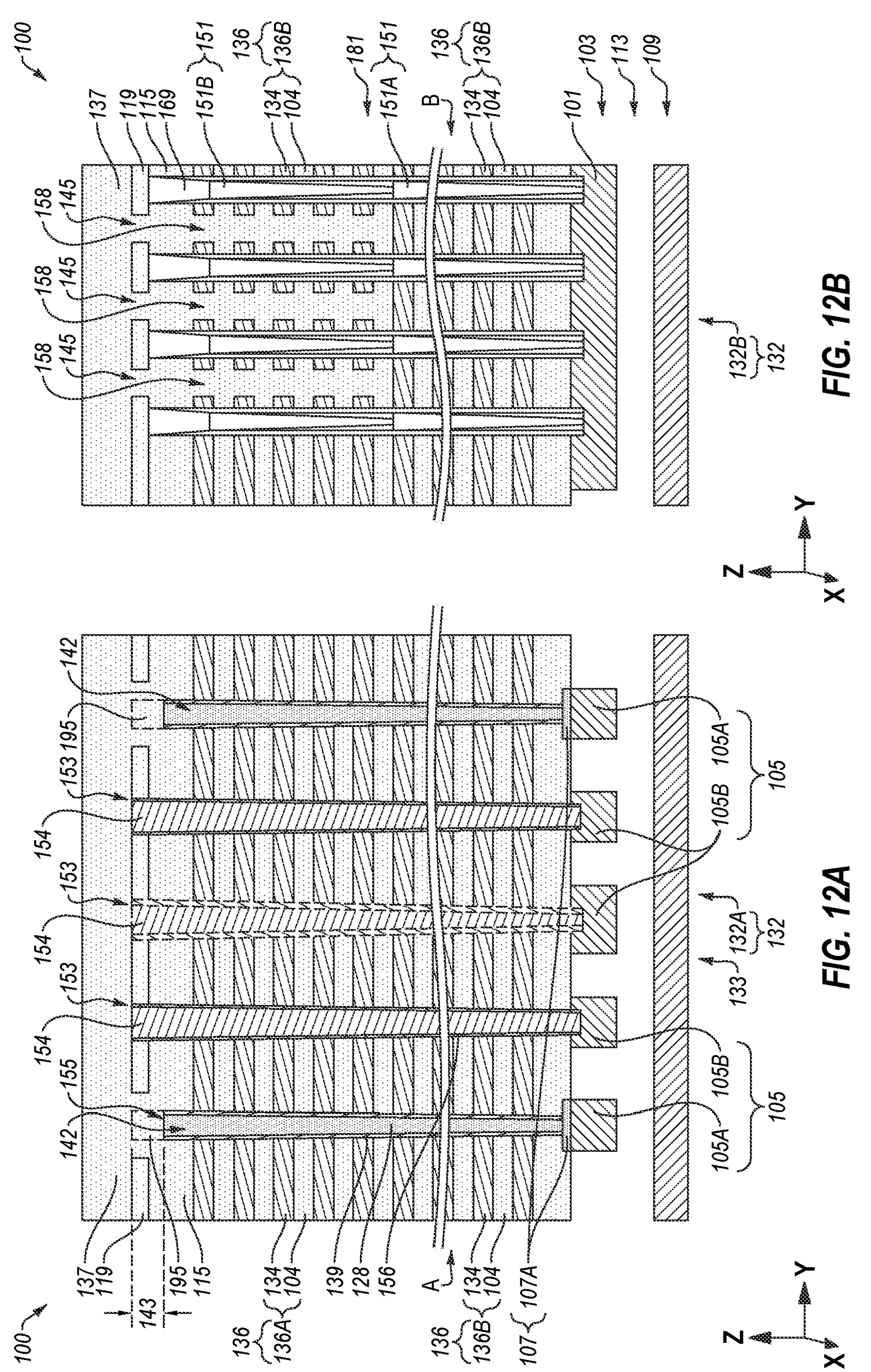
FIG. 12A is a simplified, longitudinal cross-sectional view of a portion of the microelectronic device structure shown in FIG. 11A at another processing stage.
FIG. 12B is a simplified, longitudinal cross-sectional view of the portion of the microelectronic device structure shown in FIG. 11B at the processing stage of FIG. 12A.

FIG. 12A is a simplified, longitudinal cross-sectional view of the portion A of the microelectronic device structure 100 shown in FIG. 11A at another processing stage of the method of forming the microelectronic device following the processing stage of FIGS. 11A and 11B. FIG. 12B is a simplified, longitudinal cross-sectional view of the portion B of the microelectronic device structure 100 shown in FIG. 11B at the processing stage of FIG. 12A. Referring collectively to FIGS. 12A and 12B, additional slots 158 may be formed within the stack structure 132. The additional slots 158 may partially vertically extend through the stack structure 132, and may be horizontally aligned with the additional openings 145 in the masking material 119. Like the additional openings 145 in the masking material 119, the additional slots 158 extending into the stack structure 132 may be positioned within horizontal areas of the blocks 133 of the stack structure 132, and may extend in parallel with the filled slot structures 142. Portions of the additional slots 158 may be positioned within a horizontal area of the distributed staircase region 132A and the stack structure 132, and additional portions of the additional slots 158 may be positioned within a horizontal area of the array region 132B and the stack structure 132. As shown in FIG. 12B, the additional slots 158 may be formed to be horizontally interposed between groups (e.g., rows) of the pillar structures 151 horizontally neighboring one another in the Y-direction. The additional slots 158 may sub-divide individual blocks 133 include a plurality of sub-blocks.

Still referring to FIGS. 12A and 12B, after forming the additional slots 158, a fifth dielectric cap material 137 may be formed inside and outside of the additional slots 158. The fifth dielectric cap material 137 may substantially fill the additional slots 158. The fifth dielectric cap material 137 may be formed of and include dielectric material, such as dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$). In some embodiments, the fifth dielectric cap material 137 is formed of and includes $SiO_2$. An upper boundary of the fifth dielectric cap material 137 (e.g., by way of CMP processing following deposition) may be substantially planar.

Figures 13A, 13B:
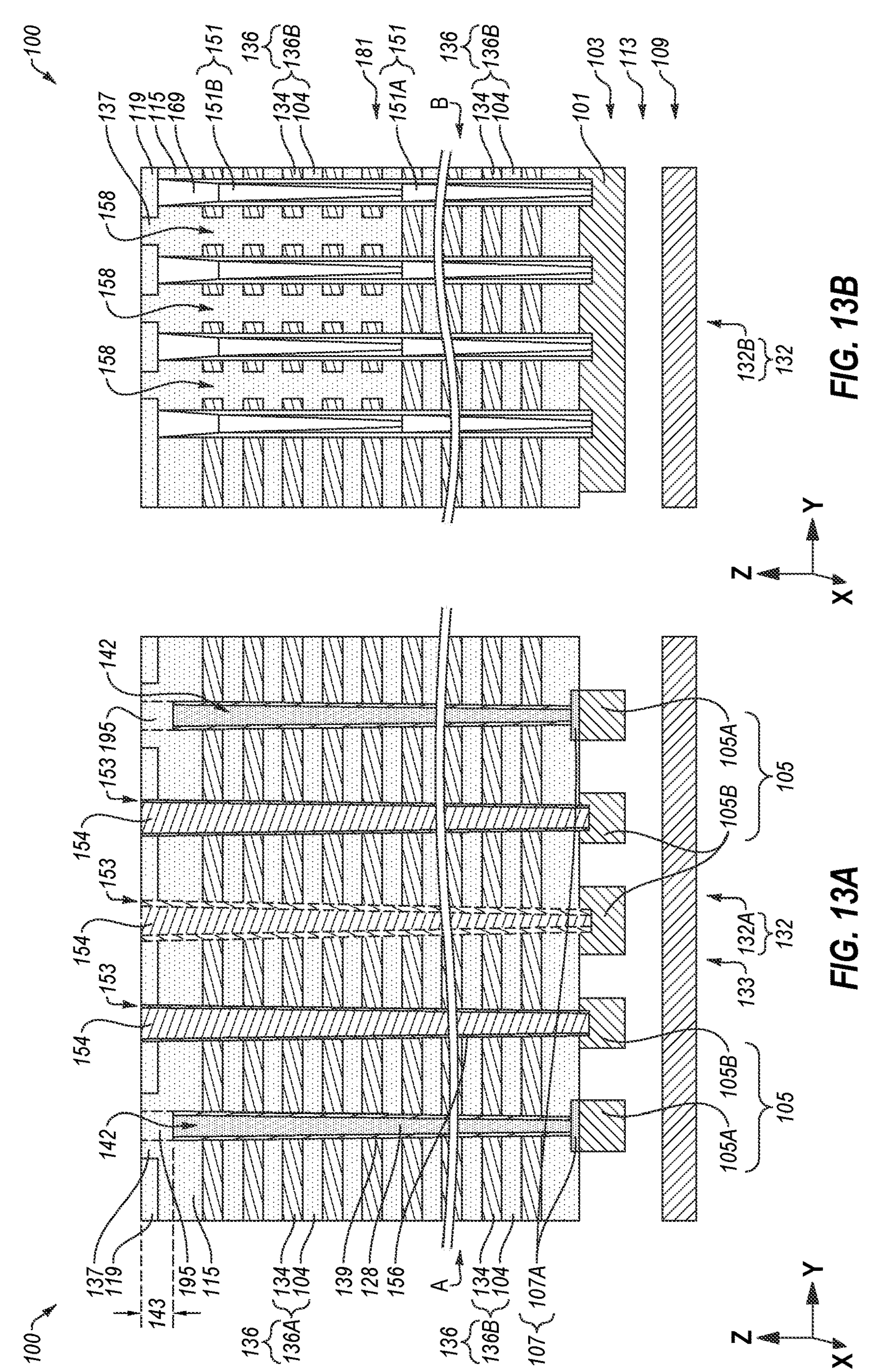
FIG. 13A is a simplified, longitudinal cross-sectional view of a portion of the microelectronic device structure shown in FIG. 12A at another processing stage.
FIG. 13B is a simplified, longitudinal cross-sectional view of the portion of the microelectronic device structure shown in FIG. 12B at the processing stage of FIG. 13A.

FIG. 13A is a simplified, longitudinal cross-sectional view of the portion A of the microelectronic device structure 100 shown in FIG. 12A at another processing stage of the method of forming the microelectronic device following the processing stage of FIGS. 12A and 12B. FIG. 13B is a simplified, longitudinal cross-sectional view of the portion B of the microelectronic device structure 100 shown in FIG. 12B at the processing stage of FIG. 13A. Referring collectively to FIGS. 13A and 13B, a portion (e.g., an upper portion) of the fifth dielectric cap material 137 may be removed (e.g., by way of CMP processing) to expose an upper surface of the masking material 119. The removal process may also remove a portion of the masking material 119, such that the thickness (Z-height) of a remaining portion of the masking material 119 depicted in FIGS. 13A and 13B is less than that of the masking material 119 depicted in FIGS. 12A and 12B. A remaining portion of the fifth dielectric cap material 137 vertically underlie an upper boundary of the remaining portion of the masking material 119, and may substantially filled the additional slots 158 extending into the stack structure 132.

Figures 14A, 14B:
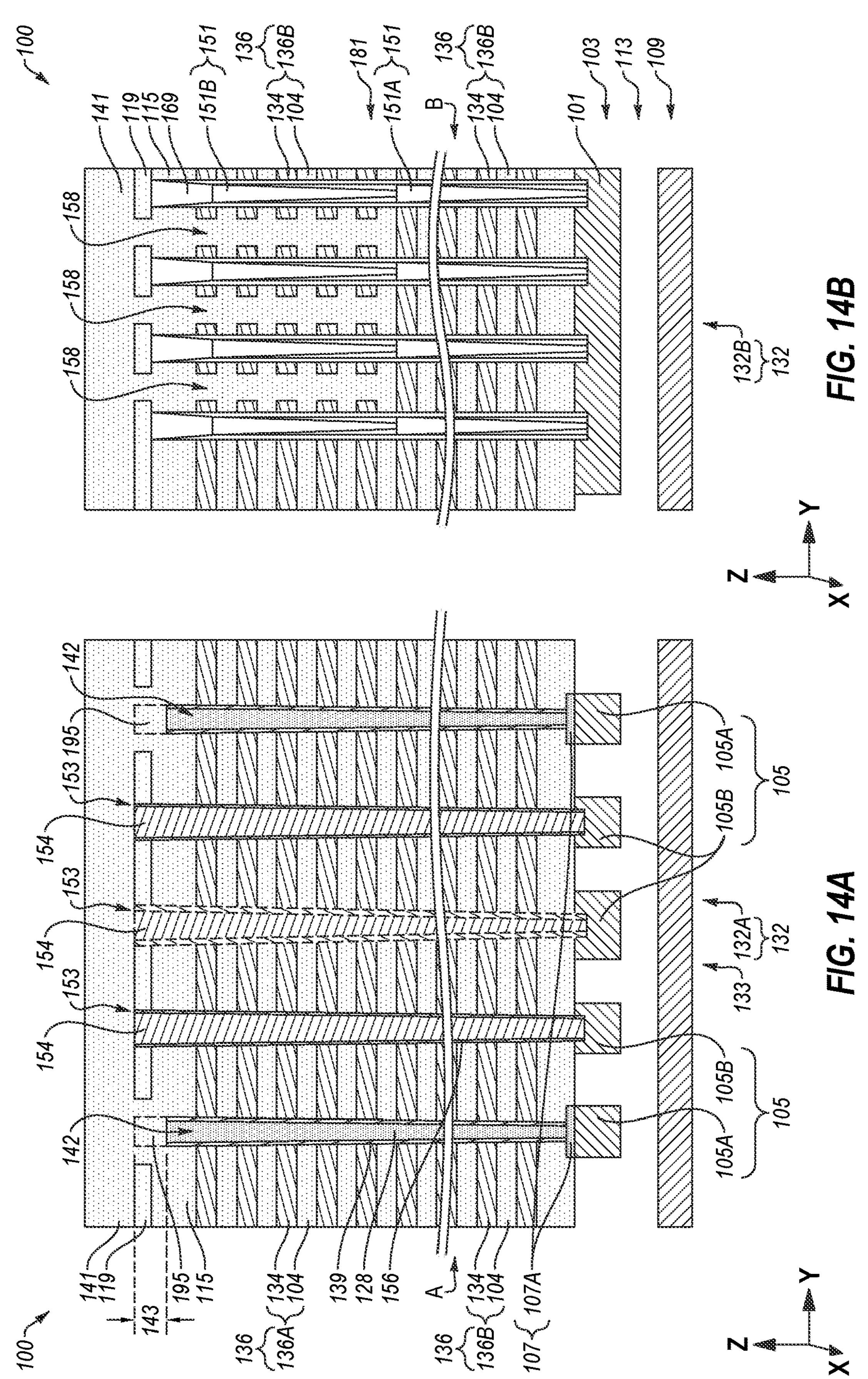
FIG. 14A is a simplified, longitudinal cross-sectional view of a portion of the microelectronic device structure shown in FIG. 13A at another processing stage.
FIG. 14B is a simplified, longitudinal cross-sectional view of the portion of the microelectronic device structure shown in FIG. 13B at the processing stage of FIG. 14A.

FIG. 14A is a simplified, longitudinal cross-sectional view of the portion A of the microelectronic device structure 100 shown in FIG. 13A at another processing stage of the method of forming the microelectronic device following the processing stage of FIGS. 13A and 13B. FIG. 14B is a simplified, longitudinal cross-sectional view of the portion B of the microelectronic device structure 100 shown in FIG. 13B at the processing stage of FIG. 14A. Referring collectively to FIGS. 14A and 14B, a sixth dielectric cap material 141 may be formed (e.g., non-conformally formed) on or over exposed surfaces of the microelectronic device structure 100. The sixth dielectric cap material 141 vertically overlies the masking material 119. An upper boundary of the sixth dielectric cap material 141 may be formed (e.g., by way of CMP processing following deposition) to be substantially planar.

The sixth dielectric cap material 141 may be formed of and include at least one dielectric material, such as at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, and $TiO_x$). In some embodiments, the sixth dielectric cap material 141 is formed of and includes $SiO_2$. In some embodiments, the sixth dielectric cap material 141 comprises dielectric oxide material formed through a CVD process employing TEOS as a precursor. In some embodiments, the sixth dielectric cap material 141 comprises a single and substantially homogeneous dielectric material that may be ascertained by techniques such as by scanning electron microscopy (SEM).

Figures 15A, 15B:
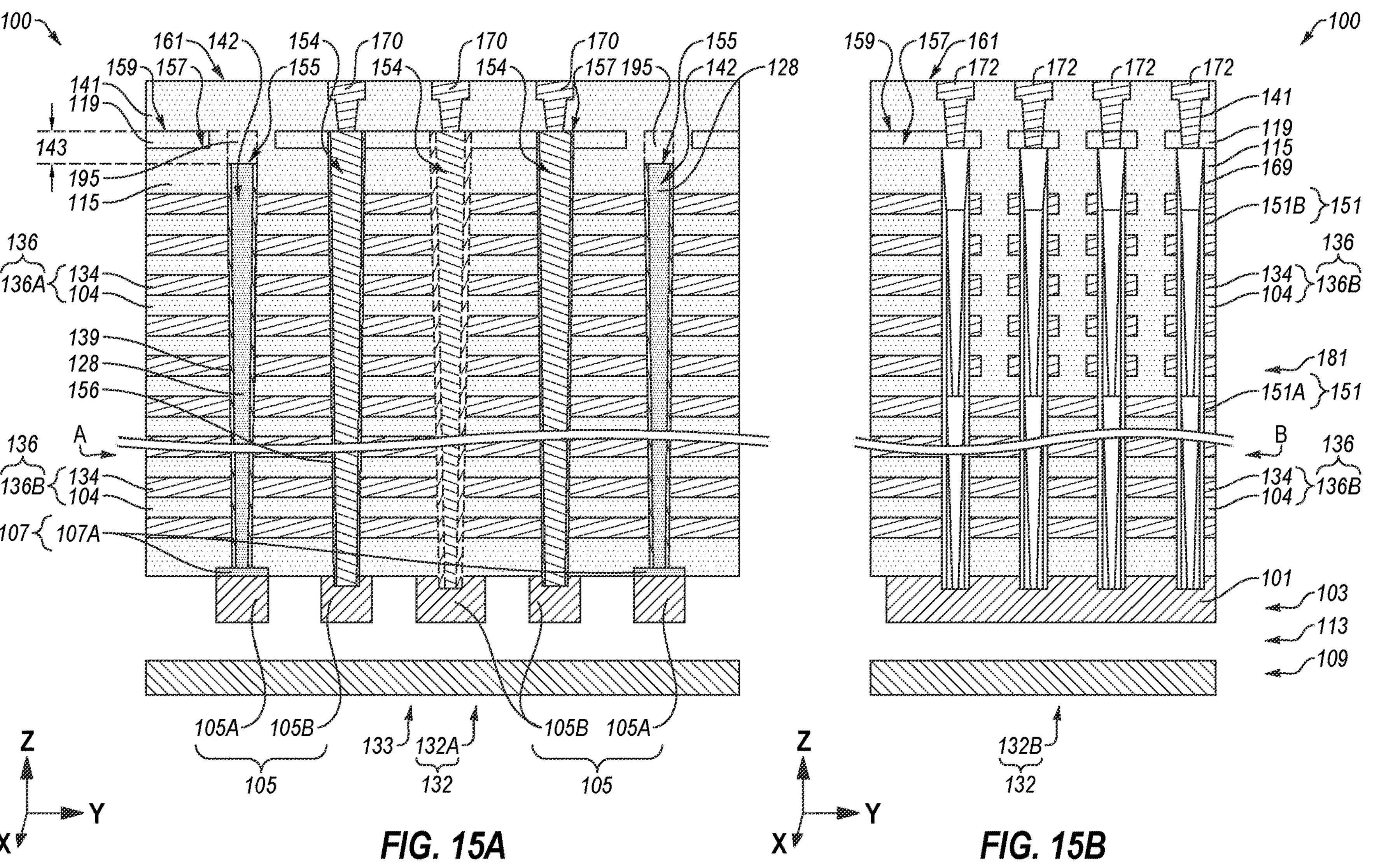
FIG. 15A is a simplified, longitudinal cross-sectional view of a portion of the microelectronic device structure shown in FIG. 14A at another processing stage.
FIG. 15B is a simplified, longitudinal cross-sectional view of the portion of the microelectronic device structure shown in FIG. 14B at the processing stage of FIG. 15A.

FIG. 15A is a simplified, longitudinal cross-sectional view of the portion A of the microelectronic device structure 100 shown in FIG. 14A at another processing stage of the method of forming the microelectronic device following the processing stage of FIGS. 14A and 14B. FIG. 15B is a simplified, longitudinal cross-sectional view of the portion B of the microelectronic device structure 100 shown in FIG. 15B at the processing stage of FIG. 15A. Referring collectively to FIGS. 15A and 15B, first conductive plug structures 170 may be formed to extend through the sixth dielectric cap material 141 and contact the contact structures 154, and second conductive plug structures 172 may be formed to extend through the sixth dielectric cap material 141 and the masking material 119 and contact the array plugs 169. In an embodiment, masking is done where patterning through the masking material 119 is accomplished for processing embodiments to further include useful registration and contacting of the second conductive plug structures 172 to the array plugs 169. Thereafter, formation of the first conductive plug structures 170 is accomplished on or over the upper surfaces of the contact structures 154 to contact the contact structures 154 at a given height 159 (Z-direction, hereinafter referred to as a third level 159) within the microelectronic device structure 100 at the stack structure 132, and formation of the second conductive plug structures 172 on or over the upper surfaces of the array plugs 169, at a given height 157 (Z-direction, hereinafter referred to as a second level 157) within the microelectronic device structure 100. The second level 157 is lower (Z-direction) than the third level 159, and the difference between the respective second and third levels 157 and 159, may be defined by the final thickness of the masking material 119. As shown in FIG. 15A, a first level 155 corresponding to the upper boundaries of the fill material 128 of the filled slot structures 142 may be below (Z-direction) the second level 157 corresponding to the upper boundaries of contact structures 154. The upper pillar structures 151B may be referred to as semiconductive pillars 151B, and the second conductive plug structures 172 extend through the masking material 119 and are coupled to the semiconductive pillars 151B.

In an embodiment, processing of the first conductive plug structures 170 and the second conductive plug structures 172 includes a trim technique to form a flattened head (T-top) for each of the first conductive plug structures 170 and the second conductive plug structures 172. A thickness (Z-direction) of the sixth dielectric cap material 141 following the formation of the first conductive plug structures 170 and the second conductive plug structures 172 may be the difference between a fourth level 161 and the third level 159. A depth below the fourth level 161 for the top of the fill material 128 of the filled slot structures 142 is the difference between the fourth level 161 and the first level 155. The height of the second conductive plug structures 172 is the difference between the fourth level 161 and the second level 157. The height of the first conductive plug structures 170 is the difference between the fourth level 161 and the third level 159. Further, the depth (Z-direction) of the fifth cap oxide material 137 is the difference between the fourth level 161 and the third level 159. In some embodiments, the sixth dielectric cap material 141 comprises a single dielectric material that may be ascertained by techniques such as by SEM, and the single dielectric material extends between the third level 159 and the fourth level 161.

Figure 16:
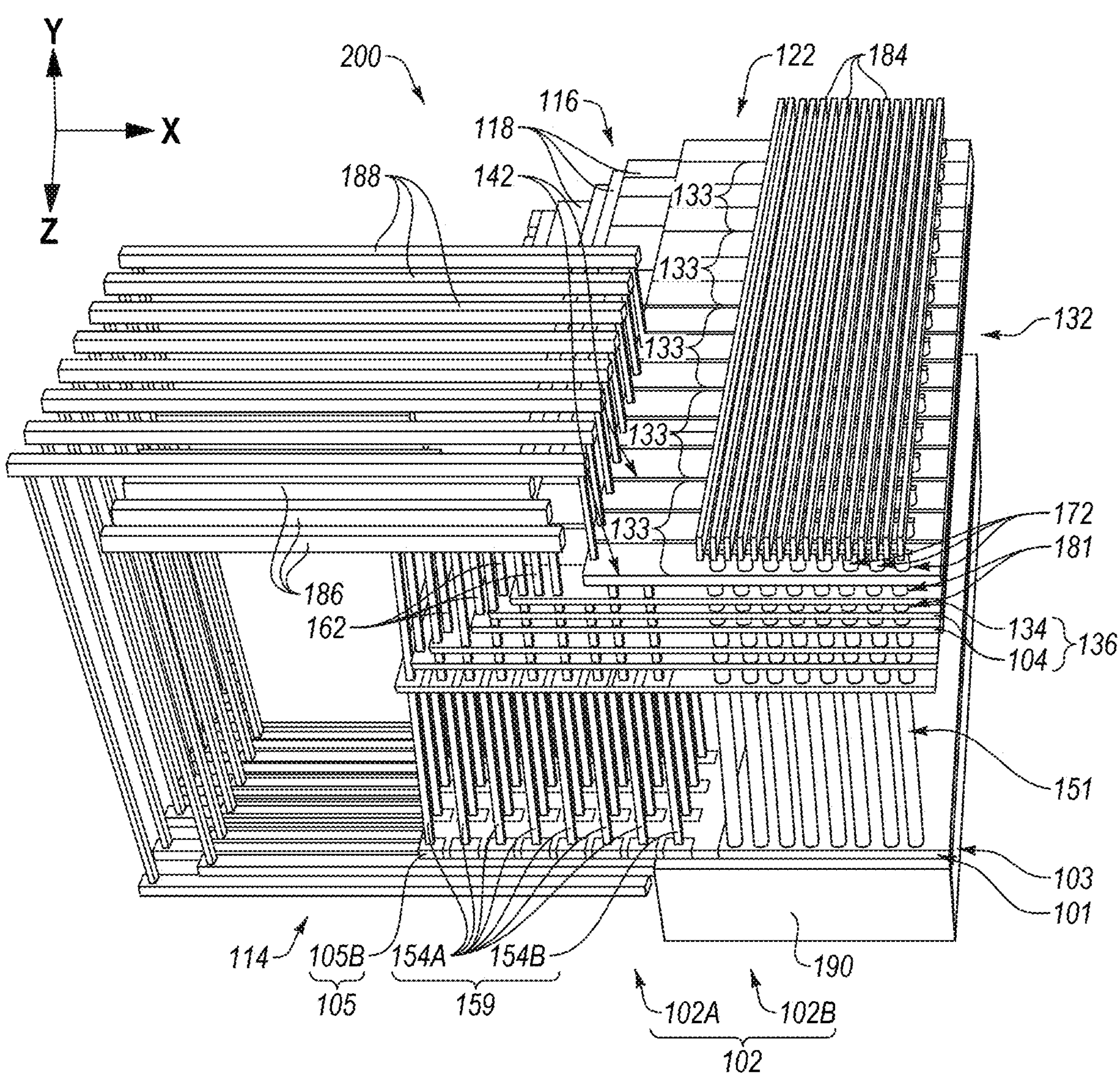
FIG. 16 illustrates a partial cutaway perspective view of a portion of a microelectronic device, according to embodiments of disclosure.

Microelectronic device structures (e.g., the microelectronic device structure 100 previously described herein of the disclosure) may be included in microelectronic devices of the disclosure. For example, FIG. 16 illustrates a partial cutaway perspective view of a portion of a microelectronic device 200 (e.g., a memory device, such as a 3D NAND Flash memory device) including the microelectronic device structure 100 following the processing stage previously described with reference to FIGS. 15A and 15B. To avoid repetition, not all features (e.g., structures, materials, regions, devices) shown in FIG. 16 are described in detail herein. Rather, unless described otherwise below, in FIG. 16, a feature designated by a reference numeral of a feature previously described with reference to the microelectronic device structure 100 (FIGS. 15A and 15B) will be understood to be substantially similar to the previously described feature. In addition, for clarity and ease of understanding the drawings and associated description, some features (e.g., structures, materials, regions, devices) of the microelectronic device structure 100 previously described herein are not shown in FIG. 16. However, it will be understood that any features of the microelectronic device structure 100 previously described with reference to FIGS. 15A and 15B may be included in the microelectronic device 200 described herein with reference to FIG. 16.

In an embodiment, some of the contact structures 154 (e.g., FIG. 15A) are employed as live contact structures 154A and some other of the contact structures 154 are support contact structures 154B. The live contact structures 154A may be employed for signal transmission, and the support contact structures 154B may not be employed for signal transmission. In addition, the microelectronic device 200 may further include access line routing structures 186, first select gates (e.g., upper select gates, drain select gates (SGDs)), select line routing structures 188, one or more second select gates (e.g., lower select gates, source select gate (SGSs)), further contact structures 162 (e.g., access line contact structures, select line contact structures), and digit line structures 184. The digit line structures 184 may vertically overlie and be coupled to the pillar structures 151 (and, hence, the strings of memory cells 181). In addition, the further contact structures 162 may couple various features of the microelectronic device 200 to one another as shown (e.g., the select line routing structures 188 to the first select gates; the access line routing structures 186 to the conductive materials 134 of the tiers 136 of the stack structure 132 underlying the first select gates and defining access line structures of the microelectronic device 200).

With continued reference to FIG. 16, the microelectronic device 200 may also include a base structure 190 positioned vertically below the pillar structures 151 (and, hence, the strings of memory cells 181). The base structure 190 may include at least one control logic region including control logic devices configured to control various operations of other features (e.g., the strings of memory cells 181) of the microelectronic device 200. As a non-limiting example, the control logic region of the base structure 190 may further include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), Vad regulators, drivers (e.g., string drivers), page buffers, decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control logic region of the base structure 190 may be coupled to the conductive source structure 101, the access line routing structures 186, the select line routing structures 188, and the digit line structures 184. In some embodiments, the control logic region of the base structure 190 includes CMOS (complementary metal-oxide-semiconductor) circuitry. In such embodiments, the control logic region of the base structure 190 may be characterized as having a "CMOS under Array" ("CuA") configuration.

Figure 17:
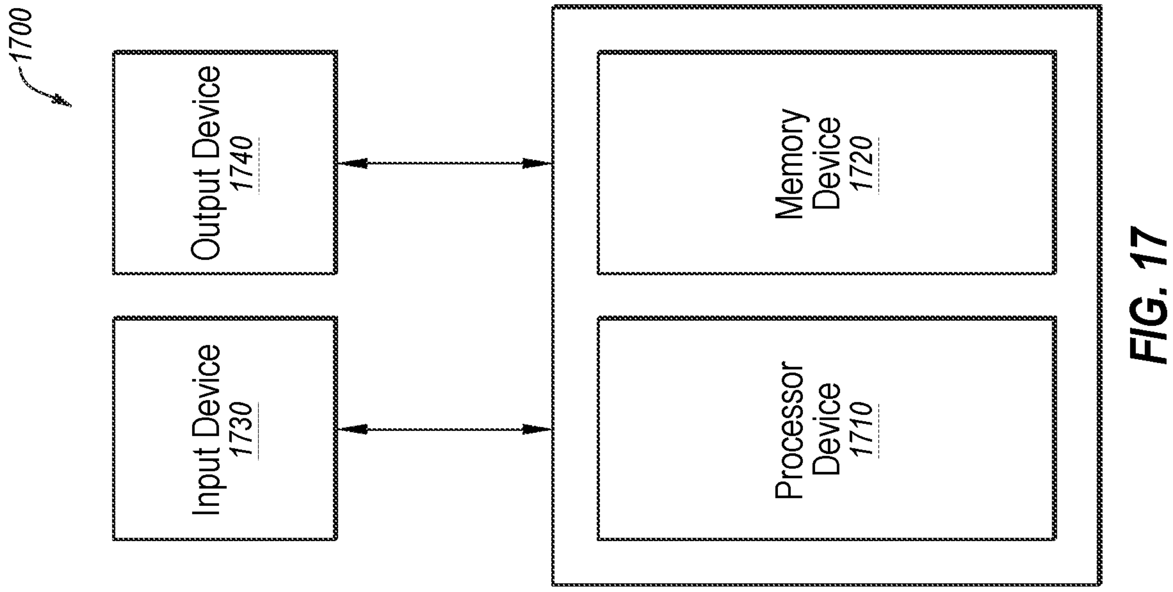
FIG. 17 is a block diagram of an electronic system, according to embodiments of disclosure.

Microelectronic devices (e.g., the microelectronic device 200 (FIG. 16)) and microelectronic device structures (e.g., the microelectronic device structure 100 (FIGS. 15A and 15B)) of the disclosure may be included in embodiments of electronic systems of the disclosure. For example, FIG. 17 is a block diagram of an electronic system 1700, according to embodiments of disclosure. The electronic system 1700 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device, etc. The electronic system 1700 includes at least one memory device 1720. The memory device 1720 may include, for example, one or more of a microelectronic device (e.g., the microelectronic device 200 (FIG. 16)) and a microelectronic device structure (e.g., the microelectronic device structure 100 (FIGS. 15A and 15B)) of the disclosure. The electronic system 1700 may further include at least one electronic signal processor device 1710 (often referred to as a "microprocessor") that is part of an integrated circuit. The electronic signal processor device 1710 may include, for example, one or more of a microelectronic device (e.g., the microelectronic device 200 (FIG. 16)) and a microelectronic device structure (e.g., the microelectronic device structure 100 (FIGS. 15A and 15B)) of the disclosure. While the memory device 1720 and the electronic signal processor device 1710 are depicted as two (2) separate devices in FIG. 17, in additional embodiments, a single (e.g., only one) memory/processor device having the functionalities of the memory device 1720 and the electronic signal processor device 1710 is included in the electronic system 1700. For example the memory device 1720 may be embedded memory in the electronic signal processor device 1710. Also for example, the memory device 1720 may be embedded memory in the electronic signal processor device 1710 such as a level-0 (L0) cache, and another embodiment of the memory device 1720 is coupled to the electronic signal processor device 1710, such as a higher-level cache that shares cache functions with DRAM devices and SRAM devices, such as SRAM devices as embedded L0 cache, DRAM devices as embedded L1 cache, and the memory device 1720 as embedded Ln cache. In such embodiments, the memory/processor device may include, for example, one or more of a microelectronic device (e.g., the microelectronic device 200 (FIG. 16)) and a microelectronic device structure (e.g., the microelectronic device structure 100 (FIGS. 15A and 15B)) of the disclosure. The electronic signal processor device 1710 and the memory device 1720 may be part of a disaggregated-die assembly.

The electronic system 1700 may further include one or more input devices 1730 for inputting information into the electronic system 1700 by a user, such as, for example, a mouse or other pointing device, a keyboard, a touchpad, a button, or a control panel. The electronic system 1700 may further include one or more output devices 1740 for outputting information (e.g., visual or audio output) to a user such as, for example, a monitor, a display, a printer, an audio output jack, and/or a speaker. In some embodiments, the input device 1730 and the output device 1740 may comprise a single touchscreen device that can be used both to input information to the electronic system 1700 and to output visual information to a user. The input device 1730 and the output device 1740 may communicate electrically with one or more of the memory device 1720 and the electronic signal processor device 1710. Thus, a microelectronic device is disclosed, comprising a stack structure comprising blocks each including a vertically alternating sequence of conductive material and insulative material arranged in tiers, at least one of the blocks comprising: a memory array region having vertically extending strings of memory cells within a horizontal area thereof; and a staircase region horizontally neighboring the memory array region and comprising: a staircase structure having steps comprising horizontal ends of the tiers; and a crest sub-region horizontally interposed between the staircase structure and the memory array region; a masking structure overlying the stack structure and having a different material composition than each of the conductive material and the insulative material; contact structures within a horizontal area of the crest sub-region of the staircase region of the at least one of the blocks, the contact structures comprising additional conductive material vertically extending through the masking structure and the stack structure; and filled slot structures interposed between the blocks of the stack structure, at least one of the filled slot structures comprising at least one fill material having an uppermost boundary vertically underlying an uppermost boundary of the masking structure.

Thus, a method of forming a microelectronic device is also disclosed, comprising: forming a preliminary stack structure comprising a vertically alternating sequence of sacrificial material and insulative material arranged in tiers, the stack structure comprising: a memory array region having pillars within a horizontal area thereof and vertically extending therethrough; and a staircase region horizontally neighboring the memory array region and comprising a crest sub-region horizontally interposed between a staircase structure and the memory array region; forming a masking structure over the preliminary stack structure; forming preliminary contact structures within the staircase region of the preliminary stack structure, the preliminary contact structures vertically extending through the masking material and the tiers of the preliminary stack structure; dividing the preliminary stack structure into preliminary blocks separated from one another by preliminary filled slot structures, the preliminary contact structures positioned within horizontal areas of the preliminary blocks; replacing the preliminary contact structures with contact structures, upper boundaries of the contact structures substantially coplanar with upper boundaries of the masking structure; removing the preliminary filled slot structures to form slots after replacing the preliminary contact structures with the contact structures; replacing the sacrificial material of the tiers of the preliminary stack structure with conductive material after removing the preliminary filled slot structures; forming filled slot structures within the slots after replacing the sacrificial material of the tiers of the preliminary stack structure with the conductive material; and forming additional insulative material over the masking material, the contact structures, and the filled slot structures.

Thus, also disclosed is an electronic system, comprising: an input device; an output device; a processor device operably coupled to the input device and the output device; and a memory device operably coupled to the processor device and comprising: a stack structure comprising blocks including tiers each comprising conductive material and insulative material vertically neighboring the conductive material, each of the blocks comprising: a memory array region having pillar structures within a horizontal area thereof, the pillar structures comprising semiconductor material vertically extending through the tiers; and a staircase region horizontally neighboring the memory array region and comprising: a staircase structure having steps comprising edges of the tiers; and a crest section intervening between the staircase structure and the memory array region; carbon nitride material overlying the stack structure and the pillar structures; slot structures comprising polycrystalline silicon horizontally interposed between the blocks of the stack structure, upper boundaries of the polycrystalline silicon below lower boundaries of the carbon nitride material;

contact structures comprising additional conductive material within horizontal boundaries of the staircase region of each of the blocks, the additional conductive material vertically extending through the carbon nitride material and the tiers of the blocks of the stack structure.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents. For example, elements and features disclosed in relation to one embodiment of the disclosure may be combined with elements and features disclosed in relation to other embodiments of the disclosure.

What is claimed is:

1. A microelectronic device, comprising:
- a stack structure comprising blocks each including a vertically alternating sequence of conductive material and insulative material arranged in tiers, at least one of the blocks comprising:
  - a memory array region having vertically extending strings of memory cells within a horizontal area thereof; and
  - a staircase region horizontally neighboring the memory array region and comprising:
    - at least one staircase structure having steps comprising horizontal ends of the tiers; and
    - a crest sub-region horizontally interposed between the staircase structure and the memory array region;
- a masking structure overlying the stack structure and having a different material composition than each of the conductive material and the insulative material;
- contact structures within a horizontal area of the crest sub-region of the staircase region of the at least one of the blocks, the contact structures comprising additional conductive material vertically extending through the masking structure and the entire stack structure;
- filled slot structures interposed between the blocks of the stack structure, at least one of the filled slot structures comprising at least one fill material having an uppermost boundary vertically underlying an uppermost boundary of the masking structure;
- first discrete conductive structures, the first discrete conductive structures underlying the stack structure with each first discrete conductive structure underlying and being adjacent to a respective one of the filled slot structures; and
- second discrete conductive structures, the second discrete conductive structures underlying the stack structure with each second discrete conductive structure underlying and contacting a respective one of the contact structures.

2. The microelectronic device of claim 1, wherein the masking structure comprises a carbon nitride material.

3. The microelectronic device of claim 1, wherein horizontal boundaries of the additional conductive material of the contact structures are positioned horizontally closer to the masking structure than are horizontal boundaries of the at least one fill material of the at least one of the filled slot structures.

4. The microelectronic device of claim 1, wherein the uppermost boundary of the at least one fill material of the at least one of the filled slot structures vertically underlies uppermost boundaries of the additional conductive material of the contact structures.

5. The microelectronic device of claim 1, further comprising additional insulative material overlying the at least one fill material of the at least one of the filled slot structures, the additional insulative material having a different material composition than the at least one fill material and at least partially vertically interposed between the uppermost boundary of the at least one fill material and the uppermost boundary of the masking structure.

6. The microelectronic device of claim 5, wherein the additional insulative material comprises dielectric oxide material.

7. The microelectronic device of claim 1, wherein the at least one fill material of the at least one of the filled slot structures comprises polycrystalline silicon.

8. The microelectronic device of claim 1, wherein the uppermost boundary of the at least one fill material of the at least one of the filled slot structures vertically underlies a lowermost boundary of the masking structure.

9. The microelectronic device of claim 8, wherein the uppermost boundary of the at least one fill material of the at least one of the filled slot structures vertically overlies an uppermost boundary of the conductive material of an uppermost one of the tiers of the stack structure.

10. The microelectronic device of claim 1, further comprising:
- first conductive plug structures within the horizontal area of the crest sub-region of the staircase region of the at least one of the blocks, and coupled vertically to the contact structures; and
- second conductive plug structures within the horizontal area of the memory array region and coupled to the vertically extending strings of memory cells, wherein the second conductive plug structures extend to a lowermost boundary of the masking structure.

11. The microelectronic device of claim 10, further comprising:
- a dielectric cap material, wherein the dielectric cap material is a single dielectric material that extends from the uppermost boundary of the masking structure to the uppermost boundary of at least one of the first conductive plug structures and the second conductive plug structures.

12. The microelectronic device of claim 1, further comprising:
- data lines overlying the masking structure and in electrical communication with the vertically extending strings of memory cells;
- a source tier underlying the stack structure and comprising at least one source structure in electrical communication with the vertically extending strings of memory cells;
- additional contact structures on at least some of the steps of the staircase structure; and
- a control device comprising control logic circuitry in electrical communication with the data lines, the at least one source structure, and the additional contact structures.

13. A method of forming a microelectronic device, comprising:
- forming a preliminary stack structure comprising a vertically alternating sequence of sacrificial material and insulative material arranged in tiers, the stack structure comprising:

a memory array region having semiconductive pillars within a horizontal area thereof and vertically extending therethrough; and a staircase region horizontally neighboring the memory array region and comprising a crest sub-region horizontally interposed between a staircase structure and the memory array region;

forming a masking structure over the preliminary stack structure;

forming preliminary contact structures within the staircase region of the preliminary stack structure, the preliminary contact structures vertically extending through the masking structure and the tiers of the preliminary stack structure;

dividing the preliminary stack structure into preliminary blocks separated from one another by preliminary filled slot structures, the preliminary contact structures positioned within horizontal areas of the preliminary blocks;

replacing the preliminary contact structures with contact structures, upper boundaries of the contact structures substantially coplanar with upper boundaries of the masking structure;

removing the preliminary filled slot structures to form slots after replacing the preliminary contact structures with the contact structures;

replacing the sacrificial material of the tiers of the preliminary stack structure with conductive material after removing the preliminary filled slot structures;

forming filled slot structures within the slots after replacing the sacrificial material of the tiers of the preliminary stack structure with the conductive material;

forming additional insulative material over the masking structure, the contact structures, and the filled slot structures;

forming first discrete conductive structures, the first discrete conductive structures underlying the preliminary stack structure with each first discrete conductive structure underlying and being adjacent to a respective one of the filled slot structures; and forming second discrete conductive structures, the second discrete conductive structures underlying the preliminary stack structure with each second discrete conductive structure underlying and contacting a respective one of the contact structures.

14. The method of claim 13, wherein forming a masking structure over the preliminary stack structure comprises:

forming a masking material over the preliminary stack structure; and forming openings within the masking material, the openings positioned at locations selected for the preliminary filled slot structures and having greater horizontal dimensions than those selected for the preliminary filled slot structures.

15. The method of claim 14, further comprising filling the openings within the masking material with dielectric material prior to forming the preliminary contact structures and the preliminary filled slot structures.

16. The method of claim 14, further comprising forming the preliminary contact structures and the preliminary filled slot structures substantially simultaneously with one another.

17. The method of claim 14, further comprising forming the preliminary contact structures and the preliminary filled slot structures to have substantially the same material compositions as one another.

18. The method of claim 14, wherein replacing the preliminary contact structures with contact structures comprises:

substantially removing the preliminary contact structures to form contact openings without substantially removing the preliminary filled slot structures;

forming dielectric liners within the contact openings; and forming conductive fill material on the dielectric liners within the contact openings.

19. The method of claim 14, wherein forming filled slot structures within the slots comprises:

forming fill material comprising one or more of dielectric material and semiconductive material inside and outside of the slots;

removing an upper portion of the fill material overlying the masking structure while retaining lower portions of the fill material within the slots; and vertically recessing the lower portions of the fill material relative to the upper boundaries of the masking structure.

20. The method of claim 14, further comprising:

forming first conductive plug structures vertically extending through the additional insulative material and contacting the contact structures in the staircase region; and forming second conductive plug structures vertically extending through the additional insulative material and the masking structure and coupling to the pillars in the memory array region.

21. An electronic system, comprising:

an input device;

an output device;

a processor device operably coupled to the input device and the output device; and a memory device operably coupled to the processor device and comprising:

a stack structure comprising blocks including tiers each comprising conductive material and insulative material vertically neighboring the conductive material, each of the blocks comprising:

a memory array region having pillar structures within a horizontal area thereof, the pillar structures comprising semiconductor material vertically extending through the tiers; and a staircase region horizontally neighboring the memory array region and comprising:

a staircase structure having steps comprising edges of the tiers; and a crest section intervening between the staircase structure and the memory array region;

a carbon nitride material overlying the stack structure and the pillar structures;

slot structures comprising polycrystalline silicon horizontally interposed between the blocks of the stack structure, upper boundaries of the polycrystalline silicon below lower boundaries of the carbon nitride material;

contact structures comprising additional conductive material within horizontal boundaries of the staircase region of each of the blocks, the additional conductive material vertically extending through the carbon nitride material and the tiers of the blocks of the stack structure;

first discrete conductive structures, the first discrete conductive structures underlying the stack structure with each first discrete conductive structure underlying and being adjacent to a respective one of the slot structures; and second discrete conductive structures, the second discrete conductive structures underlying the stack structure with each second discrete conductive structure underlying and contacting a respective one of the contact structures.

22. The electronic system of claim 21, wherein the memory device further comprises:

digit lines overlying the carbon nitride material and in electrical communication with the pillar structures;

a source tier underlying the stack structure and comprising:

a source structure in electrical communication with the pillar structures; and the second discrete conductive structures, the second discrete conductive structures being electrically isolated from the at least one source structure and in physical contact with the contact structures;

additional contact structures on at least some of the steps of the staircase structure; and control logic circuitry in electrical communication with the digit lines, the source structure, and the additional contact structures.

23. The microelectronic device of claim 1, wherein the at least one staircase structure comprises:

a forward staircase structure having first steps comprising first horizontal ends of the tiers; and a reverse staircase structure having second steps comprising second horizontal ends of the tiers.

* * * * *